US010043978B2

(12) United States Patent
Huang et al.

(10) Patent No.: US 10,043,978 B2
(45) Date of Patent: Aug. 7, 2018

(54) ORGANIC SEMICONDUCTOR FORMULATIONS

(71) Applicant: Flexterra, Inc., Skokie, IL (US)

(72) Inventors: Chun Huang, Arlington Heights, IL (US); Damien Boudinet, Zhubei (TW); Yan Zheng, Skokie, IL (US); Zhikai Wang, Roswell, GA (US); Yu Xia, Northbrook, IL (US); Theresa L. Starck, Chicago, IL (US); Antonio Facchetti, Chicago, IL (US)

(73) Assignee: Flexterra, Inc., Skokie, IL (US)

( * ) Notice: Subject to any disclaimer, the term of this patent is extended or adjusted under 35 U.S.C. 154(b) by 48 days.

(21) Appl. No.: 15/076,631

(22) Filed: Mar. 21, 2016

(65) Prior Publication Data

US 2017/0012208 A1    Jan. 12, 2017

Related U.S. Application Data

(62) Division of application No. 13/844,266, filed on Mar. 15, 2013, now Pat. No. 9,293,711.
(Continued)

(51) Int. Cl.
*H01L 51/00*    (2006.01)
*C07D 333/10*    (2006.01)
(Continued)

(52) U.S. Cl.
CPC .... *H01L 51/0053* (2013.01); *H01L 21/02579* (2013.01); *H01L 51/0003* (2013.01);
(Continued)

(58) Field of Classification Search
None
See application file for complete search history.

(56) References Cited

U.S. PATENT DOCUMENTS 7,244,960 B2    7/2007    Spreitzer et al. ............... 257/40
7,704,785 B2    4/2010    Steiger et al. ................. 438/99
(Continued)

FOREIGN PATENT DOCUMENTS

WO    2014/083328    6/2014

OTHER PUBLICATIONS

Katritzky et al., "Short Course on Heterocyclic Chemistry", Lecture 1: Introduction to Heterocyclic Chemistry. Aromaticity and Tautomerism, and Reactions of Heteroaromatic Rings with Electrophiles, University of Florida, last corrected on Dec. 23, 2003, attached as PDF pp. 1-40.*
(Continued)

*Primary Examiner* — Katie L Hammer
(74) *Attorney, Agent, or Firm* — McDonnell Boehnen Hulbert & Berghoff LLP

(57) ABSTRACT

The present teachings relate to organic semiconductor formulations including an organic semiconducting compound in a liquid medium, where the liquid medium includes (1) a compound in liquid state that has electronic properties complementary to the electronic structure of the organic semiconducting compound and optionally (2) a solvent or solvent mixture for solubilizing the organic semiconducting compound. The present formulations can be used as inks in the fabrication of organic semiconductor devices.

19 Claims, 5 Drawing Sheets

Related U.S. Application Data

(60) Provisional application No. 61/681,220, filed on Aug. 9, 2012.

(51) Int. Cl.
  *H01L 21/02* (2006.01)
  *H01L 51/05* (2006.01)
  *H01L 51/42* (2006.01)
  *H01L 51/50* (2006.01)

(52) U.S. Cl.
  CPC ...... *H01L 51/0068* (2013.01); *H01L 51/0558* (2013.01); *H01L 51/0055* (2013.01); *H01L 51/0056* (2013.01); *H01L 51/0541* (2013.01); *H01L 51/0545* (2013.01); *H01L 51/4253* (2013.01); *H01L 51/5012* (2013.01)

(56) References Cited

U.S. PATENT DOCUMENTS

| | | | |
|---|---|---|---|
| 8,038,903 B2 | 10/2011 | Spreitzer et al. | 252/301.16 |
| 8,232,550 B2 | 7/2012 | Clough et al. | 257/40 |
| 8,314,416 B2 | 11/2012 | Shkunov et al. | 257/40 |
| 2005/0176970 A1 | 8/2005 | Marks et al. | 549/41 |
| 2007/0141747 A1* | 6/2007 | Li | H01L 51/0007 438/99 |
| 2007/0221916 A1 | 9/2007 | Shkunov et al. | 257/40 |
| 2008/0035915 A1* | 2/2008 | Russell | H01L 51/0004 257/40 |
| 2008/0226941 A1 | 9/2008 | Becker et al. | 428/690 |
| 2008/0249309 A1 | 10/2008 | Facchetti | 546/37 |
| 2008/0265214 A1 | 10/2008 | Steiger | 252/500 |
| 2010/0043876 A1 | 2/2010 | Tuttle | 136/256 |
| 2010/0140600 A1 | 6/2010 | Clough et al. | 257/40 |
| 2011/0092015 A1 | 4/2011 | Clough et al. | 438/99 |
| 2011/0291054 A1 | 12/2011 | He et al. | 252/500 |
| 2012/0256136 A1 | 10/2012 | Cheon et al. | 252/500 |
| 2014/0230900 A1 | 8/2014 | Cull et al. | 136/263 |

OTHER PUBLICATIONS

Takimiya et al., "Thienoacene-Based Organic Semiconductors" Advanced Materials, 2011, 23, pp. 4347-4370; accessible online from wileyonlinelibrary.com; attached to the case file as a PDF.*

* cited by examiner

200 μM

200 μM

US 10,043,978 B2

ORGANIC SEMICONDUCTOR FORMULATIONS

CROSS-REFERENCE TO RELATED APPLICATIONS

This application is a divisional of U.S. patent application Ser. No. 13/844,266, filed on Mar. 15, 2013, which claims priority to and the benefit of U.S. Provisional Patent Application Ser. No. 61/681,220, filed on Aug. 9, 2012, the disclosure of each of which is incorporated by reference herein in its entirety.

BACKGROUND

Organic electronic, optical, and optoelectronic devices such as organic thin film transistors (OTFTs), organic light emitting diodes (OLEDs), printable circuits, organic photovoltaic devices, capacitors and sensors have active components fabricated from organic semiconductors (e.g., semiconducting small molecules and polymeric organic semiconductors). To achieve high-speed performance and efficient operation, it is desirable that both the p-type and n-type semiconductor materials in these organic semiconductor-based devices exhibit high charge carrier mobility ($\mu$) and stability under ambient conditions, and can be processed in a cost-effective manner.

Achieving organic semiconductor formulations that can enable mass production of organic semiconductor devices has proven very challenging. While several papers in the literature reported high charge carrier mobilities for field-effect transistors fabricated with solution-processed semiconducting films, the organic semiconductor formulations that were used have drawbacks such as poor stability upon cooling, very limited q-times, use of environmentally unacceptable solvents, and incompatibility with large-scale standard manufacturing processes.

Accordingly, there is a need in the art to develop new organic semiconductor formulations that enable high charge carrier mobilities and are compatible with large-scale standard manufacturing processes.

SUMMARY

In light of the foregoing, the present teachings provide organic semiconductor formulations that can exhibit properties such as tailored compatibility with a given organic semiconductor, improved long-term and chemical stability, low-temperature processability, and large processing versatility. As a result, field effect devices such as thin film transistors that are fabricated with the present semiconductor formulations can have high performance under ambient conditions, for example, demonstrating one or more of large charge mobilities, low threshold voltages, and high current on-off ratios.

In various embodiments, the present teachings provide formulations that include an organic semiconducting compound (OSC) in a liquid medium, where the liquid medium includes a compound in liquid state (a "first liquid") that has electronic properties complementary to the electronic structure of the OSC, and optionally, a solvent or solvent mixture (a "second liquid") for solubilizing the OSC. For example, in embodiments where the formulation includes an n-type or electron-transporting OSC, an electron-rich aromatic compound is included in the formulation as the first liquid to induce beneficial interaction through intermolecular aromatic stacking. Conversely, in embodiments where the formulation includes a p-type or hole-transporting OSC, an electron-poor aromatic compound is included in the formulation as the first liquid.

The present teachings also provide methods for fabricating organic semiconductor devices using the formulations described herein, as well as electronic, optical and optoelectronic devices (such as OPV and OFET devices) prepared from such methods and formulations.

The foregoing as well as other features and advantages of the present teachings will be more fully understood from the following figures, description, examples, and claims.

BRIEF DESCRIPTION OF THE DRAWINGS

It should be understood that the drawings described below are for illustration purpose only. The drawings are not necessarily to scale, with emphasis generally being placed upon illustrating the principles of the present teachings. The drawings are not intended to limit the scope of the present teachings in any way.

DETAILED DESCRIPTION

Figure 1:
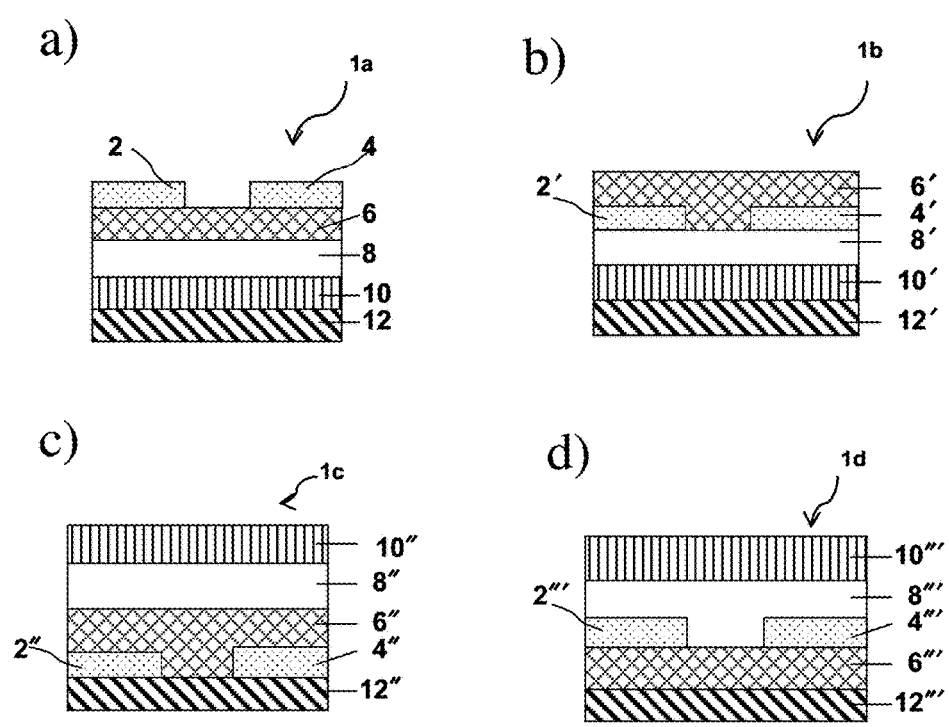
FIG. 1 illustrates four different configurations of thin film transistors: a) bottom-gate top contact, b) bottom-gate bottom-contact, c) top-gate bottom-contact, and d) top-gate top-contact; each of which can include an active channel material prepared from a formulation according to the present teachings.

The present teachings provide organic semiconductor formulations that are suitable for high-volume production of organic electronic, optical, and optoelectronic devices such as organic thin film transistors (OTFTs), organic light-emitting transistors (OLETs), organic light-emitting diodes (OLEDs)

(OLEDs), and organic photovoltaics (OPVs), in particular, via solution-phase processes such as spin-coating and printing.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and can be optionally substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which can be optionally substituted as described herein. In embodiments where the cyclic moiety is a "polycyclic moiety," the "polycyclic moiety" can include two or more rings fused to each other (i.e., sharing a common bond) and/or connected to each other via a spiro atom, or one or more bridged atoms. A polycyclic moiety can include an 8-24 membered aromatic or non-aromatic, carbocyclic or heterocyclic ring, such as a $C_{8-24}$ aryl group or an 8-24 membered heteroaryl group, each of which can be optionally substituted as described herein.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly π-conjugated and can include polycyclic aromatic hydrocarbons such as rylenes (or analogs thereof containing one or more heteroatoms) having the formula:

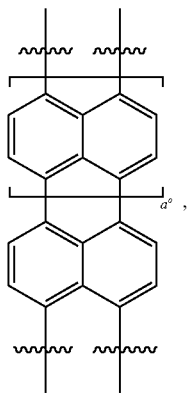

where $a^o$ can be an integer in the range of 0-3; coronenes (or analogs thereof containing one or more heteroatoms) having the formula:

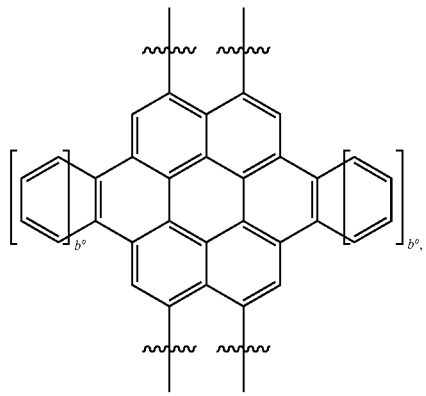

where $b^o$ can be an integer in the range of 0-3; linear acenes (or analogs thereof containing one or more heteroatoms) having the formula:

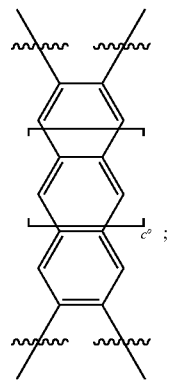

where $c^o$ can be an integer in the range of 0-4. The fused ring moiety can be optionally substituted as described herein.

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neopentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula $-C_sH_{2s+1-t}X^0_t$, where $X^0$, at each occurrence, is F, Cl, Br or I, s is an integer in the range of 1 to 40, and t is an integer in the range of 1 to 81, provided that t is less than or equal to 2s+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxy, hexoxy groups, and the like. The alkyl group in the —O-alkyl group can be substituted as described herein. For example, an —O-haloalkyl group is considered within the definition of "alkoxy" as used herein.

As used herein, "alkylthio" refers to an —S-alkyl group (which, in some cases, can be expressed as $-S(O)_w$-alkyl, wherein w is 0). Examples of alkylthio groups include, but are not limited to, methylthio, ethylthio, propylthio (e.g., n-propylthio and isopropylthio), t-butylthio, pentylthio, hexylthio groups, and the like. The alkyl group in the —S-alkyl group can be substituted as described herein.

As used herein, "arylalkyl" refers to an -alkyl-aryl group, where the arylalkyl group is covalently linked to the defined chemical structure via the alkyl group. An arylalkyl group is within the definition of a —Y—$C_{6-14}$ aryl group, where Y is defined as a divalent alkyl group that can be optionally substituted as described herein. An example of an arylalkyl group is a benzyl group ($-CH_2-C_6H_5$). An arylalkyl group can be optionally substituted, i.e., the aryl group and/or the alkyl group, can be substituted as disclosed herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, "cycloalkyl" refers to a non-aromatic carbocyclic group including cyclized alkyl, alkenyl, and alkynyl groups. In various embodiments, a cycloalkyl group can have 3 to 24 carbon atoms, for example, 3 to 20 carbon atoms (e.g., $C_{3-14}$ cycloalkyl group). A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 24 ring atoms, for example, 3 to 20 ring atoms (e.g., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

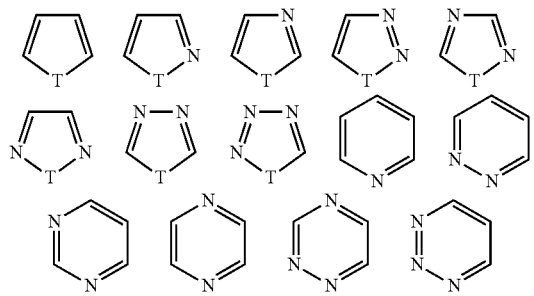

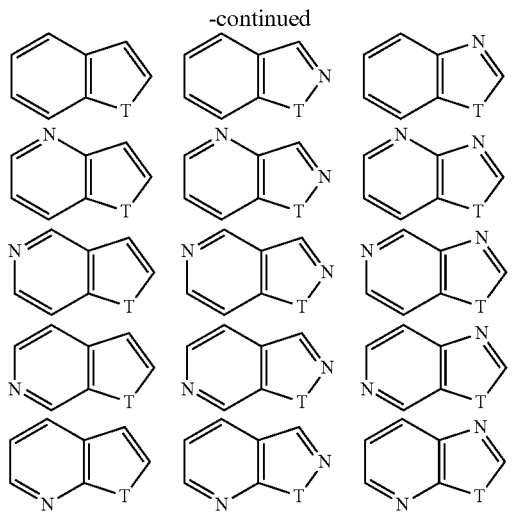

where T is O, S, NH, N-alkyl, N-aryl, N-(arylalkyl) (e.g., N-benzyl), $SiH_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Compounds of the present teachings can include a "divalent group" defined herein as a linking group capable of forming a covalent bond with two other moieties. For example, compounds of the present teachings can include a divalent $C_{1-20}$ alkyl group (e.g., a methylene group), a divalent $C_{2-20}$ alkenyl group (e.g., a vinylyl group), a divalent $C_{2-20}$ alkynyl group (e.g., an ethynylyl group), a divalent $C_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group). Generally, a chemical group (e.g., —Ar—) is understood to be divalent by the inclusion of the two bonds before and after the group.

At various places in the present specification, substituents are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

Compounds described herein can contain an asymmetric atom (also referred as a chiral center) and some of the compounds can contain two or more asymmetric atoms or centers, which can thus give rise to optical isomers (enantiomers) and diastereomers (geometric isomers). The present teachings include such optical isomers and diastereomers, including their respective resolved enantiomerically or diastereomerically pure isomers (e.g., (+) or (−) stereoisomer) and their racemic mixtures, as well as other mixtures of the enantiomers and diastereomers. In some embodiments, optical isomers can be obtained in enantiomerically enriched or pure form by standard procedures known to those skilled in the art, which include, for example, chiral separation, diastereomeric salt formation, kinetic resolution, and asymmetric synthesis. The present teachings also encompass cis- and trans-isomers of compounds containing alkenyl moieties (e.g., alkenes, azo, and imines). It also should be understood that the compounds of the present teachings encompass all possible regioisomers in pure form and mixtures thereof. In some embodiments, the preparation of the present compounds can include separating such isomers using standard separation procedures known to those skilled in the art, for example, by using one or more of column chromatography, thin-layer chromatography, simulated moving-bed chromatography, and high-performance liquid chromatography. However, mixtures of regioisomers can be used similarly to the uses of each individual regioisomer of the present teachings as described herein and/or known by a skilled artisan.

It is specifically contemplated that the depiction of one regioisomer includes any other regioisomers and any regioisomeric mixtures unless specifically stated otherwise.

As used herein, a "p-type semiconductor material," "p-type semiconductor" or a "p-type OSC" refers to a semiconductor material or a semiconducting compound having holes as the majority current or charge carriers. In some embodiments, when a p-type semiconductor material is deposited on a substrate, it can provide a hole mobility in excess of about $10^{-5}$ cm$^2$/Vs. In the case of field-effect devices, a p-type semiconductor can also exhibit a current on/off ratio of greater than about 10. In certain embodiments, a p-type OSC can be characterized by a highest occupied molecular orbital (HOMO) energy that is higher than or about −6.2 V, preferably higher than or about −6.0 V, and more preferably, higher than or about −5.8 V.

As used herein, an "n-type semiconductor material," an "n-type semiconductor" or an "n-type OSC" refers to a semiconductor material or a semiconducting compound having electrons as the majority current or charge carriers. In some embodiments, when an n-type semiconductor material is deposited on a substrate, it can provide an electron mobility in excess of about $10^{-5}$ cm$^2$/Vs. In the case of field-effect devices, an n-type semiconductor can also exhibit a current on/off ratio of greater than about 10. In certain embodiments, an n-type OSC can be characterized by a lowest unoccupied molecular orbital (LUMO) energy that is lower than or about −3.8 V, preferably lower than or about −4.0 V, and more preferably, lower than or about −4.2 V.

As used herein, "mobility" refers to a measure of the velocity with which charge carriers, for example, holes (or units of positive charge) in the case of a p-type semiconductor material and electrons in the case of an n-type semiconductor material, move through the material under the influence of an electric field. This parameter, which limited depends on the device architecture, can be measured using a field-effect device or space-charge current measurements.

Generally, the present formulation includes either an n-type (or electron-transporting) organic semiconducting compound ("n-type OSC") or a p-type (or hole-transporting) organic semiconducting compound ("p-type OSC") in a liquid medium, where the liquid medium includes a first liquid (which is an aromatic compound) having electronic properties that are complementary to the electronic structure of the OSC. More specifically, for n-type OSCs which are known to have low-lying molecular orbital energy levels, an electron-rich liquid ("ERL") is used as the first liquid to help promote electron injection and transport after film deposition and the liquid medium is removed. For p-type OSCs which are known to possess high-lying molecular orbital energy levels, an electron-poor liquid ("EPL") is used as the first liquid to provide more efficient hole injection and transport in the solid state. In some embodiments, the OSC may have satisfactory solubility in the first liquid and accordingly, the first liquid can be the only liquid in the liquid medium. In other embodiments, the liquid medium can include a second liquid, which itself can be a single solvent or a solvent mixture, for solubilizing the OSC. As used herein, each of the first liquid and the second liquid is considered a "liquid" as long as it is in the liquid state at about 1 atm at a temperature of about 50° C. or less. In some embodiments, the present formulation can include an aromatic additive as described herein.

As used herein, an electron-neutral liquid ("ENL") is (1) a liquid at about 1 atm at a temperature of about 50° C. or less and (2) a carbocyclic aromatic compound (e.g., benzene, naphthalene, anthracene) which either is unsubstituted or is substituted only with one or more identical or different electron-neutral functional groups ("FGs"). As used herein, "electron-neutral" functional groups are those with a para Hammett coefficient ($\sigma_p$) that is less than about |0.25|, preferably less than about |0.20|, examples of which include, but are not limited to, chloro groups, alkyl groups and cycloalkyl groups.

The electron-donating or electron-withdrawing properties of several hundred of the most common substituents, reflecting all common classes of substituents have been determined, quantified, and published. Hammett σ values have been used as the most common quantification of the electron-donating and electron-withdrawing properties of functional groups or substituents. Hydrogen has a Hammett σ value of zero, while other substituents have Hammett values that increase positively or negatively in direct relation to their electron-withdrawing or electron-donating characteristics. Substituents with negative Hammett σ values are considered electron-donating, while those with positive Hammett σ values are considered electron-withdrawing. See Lange's Handbook of Chemistry, 12th ed., McGraw Hill, 1979, Table 3-12, pp. 3-134 to 3-138, which lists Hammett σ values for a large number of commonly encountered substituents and is incorporated by reference herein. Table 1 below is a reproduction from March's Advanced Organic Chemistry: Reactions, Mechanisms and Structure, 4th ed., John Wiley & Sons: New York, 1992, which provides the para Hammett coefficient ($\sigma_r$) of various substitution groups. An extended table of $\sigma_p$ values can be found in Hansch, C.

et al., "A survey of Hammett substituent constants and resonance and field parameters," *Chem. Rev.*, 91(2): 165-196 (1991).

TABLE 1

The para Hammett coefficient ($\sigma_p$) of some common substitution groups.[1]

| Group | $\sigma_p$ |
|---|---|
| O[−] | −0.81 |
| NMe$_2$ | −0.63 |
| NH$_2$ | −0.57 |
| OH | −0.38 |
| OMe | −0.28 |
| CMe$_3$ | −0.15 |
| Me | −0.14 |
| H | 0 |
| Ph | 0.05 |
| COO[−] | 0.11 |
| F | 0.15 |
| Cl | 0.24 |
| Br | 0.26 |
| I | 0.28 |
| N=NPh | 0.34 |
| COOH | 0.44 |
| COOR | 0.44 |
| COMe | 0.47 |
| CF$_3$ | 0.53 |
| NH$_3{}^+$ | 0.60 |
| CN | 0.70 |
| SO$_2$Me | 0.73 |
| NO$_2$ | 0.81 |
| NMe$_3{}^+$ | 0.82 |
| N$_2{}^+$ | 1.93 |

[1]Partial reproduction of Table 9.4 from March's Advanced Organic Chemistry: Reactions, Mechanisms and Structure, 4th ed., John Wiley & Sons: New York, 1992, pp. 280.

In certain embodiments, an ENL can be represented by the formula:

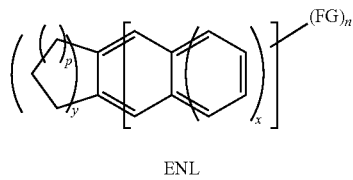

ENL wherein each FG, independently, can be a chloro, a $C_{1-6}$ alkyl group (e.g., methyl, ethyl, propyl, and so forth) or a $C_{3-8}$ cycloalkyl group; n is 0, 1, 2, 3 or 4; p is 0, 1 or 2; x is 0, 1 or 2; and y is 0 or 1. Examples of ENL include, but are not limited to, benzene, toluene, o-xylene, m-xylene, p-xylene, chlorobenzene, 1,2-dichlorobenzene, 1,2,4-trichlorobenzene, 4-chlorotoluene, 2-chlorotoluene, cyclohexylbenzene, 1-methyl naphthalene, and 2-methylnaphthalene.

As used herein, an electron-rich liquid ("ERL") is (1) a liquid at about 1 atm at a temperature of about 50° C. or less and (2) an aromatic compound having either at least one electron-donating functional group as a substituent, an electron-rich aromatic core, or both. For example, in some embodiments, an ERL can be an aromatic carbocyclic compound substituted with at least one electron-donating functional group that is in liquid state at about 1 atm at a temperature of about 50° C. or less. In other embodiments, an ERL can be an electron-rich heteroaryl compound optionally substituted with one or more electron-donating functional groups that is in liquid state at about 1 atm at a temperature of about 50° C. or less. An electron-donating functional group ("FG$^{ed}$") is a functional group that donates electrons to a neighboring atom more than a hydrogen atom would if it occupied the same position in a molecule. As used herein, an electron-donating functional group ("FG$^{ed}$") can be defined more narrowly as a functional group having a para Hammett coefficient ($\sigma_p$) of less than about −0.20, preferably less than about −0.25. Examples of FG$^{ed}$s include —Y—OH, —Y—OR$^a$, —Y—SH, —Y—SR$^a$, —OC(O)H, —OC(O)R$^a$, —P(R$^a$)$_2$, —NH$_2$, —NHNH$_2$, —NHR$^a$, and —N(R$^a$)$_2$; where R$^a$, at each occurrence, independently is a $C_{1-20}$ alkyl group, a —Y—$C_{6-14}$ aryl group, a —Y—$C_{3-14}$ cycloalkyl group, -L-OH or -L-O—$C_{1-20}$ alkyl group; where L is a divalent $C_{1-20}$ alkyl group, —Y—$C_{6-14}$ aryl-Y—, or —Y—$C_{3-14}$ cycloalkyl-Y—; Y is a divalent $C_{1-20}$ alkyl group or a covalent bond; where each of the $C_{6-14}$ aryl group and the $C_{3-14}$ cycloalkyl group optionally can be substituted with 1-4 groups independently selected from a methyl group, an ethyl group, a propyl group, a methoxy group, an ethoxy group, a propoxy group, a hydroxyl group, and an amino group.

In certain embodiments, an ERL can be represented by the formula:

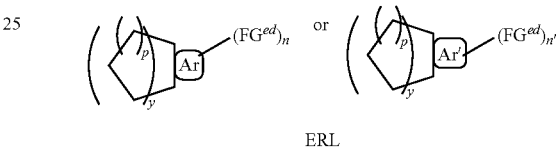

ERL wherein Ar is a phenyl group or a naphthyl group; Ar' is an electron-rich 5-14 membered heteroaryl group or a phenyl group fused to an electron-rich 5-, 6- or 7-membered cyclo-heteroalkyl group; n is 1, 2, 3 or 4; n' is 0, 1, 2, 3 or 4; p is 0, 1 or 2; y is 0 or 1; and FG$^{ed}$ is as defined herein. Ar and Ar', in addition to being substituted or optionally substituted with at least one FG$^{ed}$, respectively, further can be optionally substituted with one or more FGs (e.g., Cl and/or $C_{1-6}$ alkyl groups).

Various unsubstituted heteroaryl groups can be described as electron-rich (or π-excessive) or electron-poor (or π-deficient). Such classification is based on the average electron density on each ring atom as compared to that of a carbon atom in benzene. Examples of electron-rich systems include 5-membered heteroaryl groups having one heteroatom such as furan, pyrrole, and thiophene; and their benzofused counterparts such as benzofuran, benzopyrrole, and benzothiophene. Examples of electron-poor systems include 5-membered heteroaryl groups having two or more heteroatoms such as thiazole, imidazole, triazole, and tetrazole; 6-membered heteroaryl groups having one or more heteroatoms such as pyridine, pyrazine, and pyridazine, and pyrimidine; as well as their benzo- or pyridine-fused counterparts such as quinoline, isoquinoline, quinoxaline, cinnoline, phthalazine, naphthyridine, quinazoline, phenanthridine, acridine, and purine.

Accordingly, in some embodiments, an ERL can have an aromatic core selected from the group consisting of benzene, naphthalene, and tetrahydronaphthalene (or tetraline), where the aromatic core is substituted with at least one FG$^{ed}$ selected from the group consisting of —NH$_2$, —NH($C_{1-20}$ alkyl), —N($C_{1-20}$ alkyl)$_2$, —NHNH$_2$, —NH($C_{1-20}$ alkanol), —N($C_{1-20}$ alkanol)$_2$, —NH($C_{1-20}$ alkyl-O—$C_{1-20}$ alkyl), —N($C_{1-20}$ alkyl-O—$C_{1-20}$ alkyl)$_2$, —OH, a $C_{1-20}$ alkoxy group, —$C_{1-20}$ alkyl-OH, —$C_{1-20}$ alkyl group —O—$C_{1-20}$ alkyl group, —O—$C_{1-20}$ alkyl-OH, —O—$C_{1-20}$ alkyl-O—

$C_{1-20}$ alkyl group, —O—C(O)H, —O—C(O)—$C_{1-20}$ alkyl group, —SH, a $C_{1-20}$ alkylthio group, —$C_{1-20}$ alkyl-SH, —$C_{1-20}$ alkyl-S—$C_{1-20}$ alkyl group, —S—$C_{1-20}$ alkyl-OH, —S—$C_{1-20}$ alkyl-O—$C_{1-20}$ alkyl group, —PH$_2$, —PH—$C_{1-20}$ alkyl group, and —P($C_{1-20}$ alkyl)$_2$ group. In other embodiments, an ERL can have an aromatic core selected from the group consisting of thiophene, furan, pyrrole, benzothiophene, benzofuran, indole, isoindole, and carbazole, where the aromatic core can be optionally substituted with at least one $FG^{ed}$ as described herein. In yet other embodiments, an ERL can have an aromatic core consisting of a phenyl group fused to a cycloheteroalkyl group comprising at least one of —O—, —S—, and —NR— in the ring, where the cycloheteroalkyl group can be one

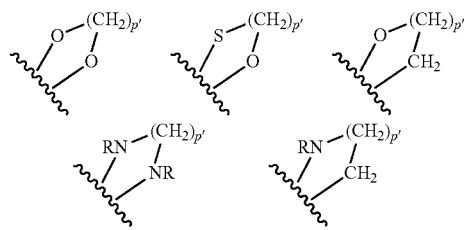

where R is H or a $C_{1-6}$ alkyl group; and p' is 1, 2 or 3.

As used herein, an electron-poor liquid ("EPL") is (1) a liquid at about 1 atm at a temperature of about 50° C. or less and (2) an aromatic compound having either at least one electron-withdrawing functional group as a substituent, an electron-poor aromatic core, or both. For example, in some embodiments, an EPL can be an aromatic carbocyclic compound substituted with at least one electron-withdrawing functional group that is in liquid state at about 1 atm at a temperature of about 50° C. or less. In other embodiments, an ERL can be an electron-poor heteroaryl compound optionally substituted with one or more electron-withdrawing functional groups that is in liquid state at about 1 atm at a temperature of about 50° C. or less. An electron-withdrawing functional group ("$FG^{ewd}$") is a functional group that draws electrons to itself more than a hydrogen atom would if it occupied the same position in a molecule. As used herein, an electron-withdrawing functional group ("$FG^{ewd}$") can be defined more narrowly as a functional group having a para Hammett coefficient ($\sigma_o$) greater than about +0.20, preferably greater than about +0.25. Examples of electron-withdrawing groups include, but are not limited to, —NO$_2$, —CN, —NC, —S(R$^b$)$_2$$^+$, —N(R$^b$)$_3$$^+$, —SC$_3$H, —SO$_2$R$^b$, —SO$_3$R$^b$, —SO$_2$NHR$^b$, —SO$_2$N(R$^b$)$_2$, —COOH, —COR$^b$, —COOR$^b$, —CONHR$^b$, —CON(R$^b$)$_2$, and $C_{1-20}$ haloalkyl groups (e.g., CF$_3$); where each R$^b$, independently is a $C_{1-20}$ alkyl group, a $C_{1-20}$ haloalkyl group, a —Y'—$C_{6-14}$ aryl group, or a —Y'—$C_{3-14}$ cycloalkyl group; Y' is a divalent $C_{1-20}$ alkyl group, a divalent $C_{1-20}$ haloalkyl group or a covalent bond; and where each of the $C_{6-14}$ aryl group and the $C_{3-14}$ cycloalkyl group optionally can be substituted with 1-4 groups independently selected from F, Cl, Br, I, a methyl group, an ethyl group, and a propyl group.

In certain embodiments, an EPL can be represented by the formula:

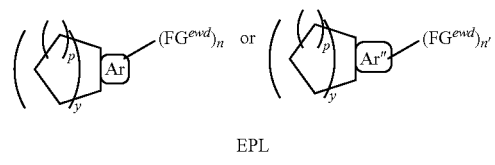

EPL wherein Ar is a phenyl group or a naphthyl group; Ar" is an electron-poor 5-14 membered heteroaryl group or a phenyl group fused to an electron-poor 5-, 6- or 7-membered cycloheteroalkyl group where the cycloheteroalkyl group includes at least one of —C(O)—, —SO$_2$—, and —CF$_2$— in the ring; n is 1, 2, 3 or 4; n' is 0, 1, 2, 3 or 4; p is 0, 1 or 2; y is 0 or 1; and $FG^{ewd}$ is as defined herein. Ar and Ar", in addition to being substituted or optionally substituted with at least one $FG^{ewd}$, further can be optionally substituted with one or more FGs (e.g., Cl and/or $C_{1-6}$ alkyl groups).

Accordingly, in some embodiments, an EPL can have an aromatic core selected from the group consisting of benzene, naphthalene, and tetrahydronaphthalene (or tetraline), where the aromatic core is substituted with at least one $FG^{ewd}$ selected from the group consisting of —NO$_2$, —CN, —NC, —S(R$^b$)$_2$$^+$, —N(R$^b$)$_3$$^+$, —SC$_3$H, —SO$_2$R$^b$, —SO$_3$R$^b$, —SO$_2$NHR$^b$, —SO$_2$N(R$^b$)$_2$, —COOH, —COR$^b$, —COOR$^b$, —CONHR$^b$, —CON(R$^b$)$_2$, and $C_{1-20}$ haloalkyl groups (e.g., CF$_3$), where R$^b$ is as defined herein. In other embodiments, an EPL can have an aromatic core selected from the group consisting of pyridine, pyrazine, pyridazine, tetrazine, quinolone, quinoxaline, cinnoline, thiazole, imidazole, triazole, tetrazole, and benzothiazole, where the aromatic core can be optionally substituted with at least one $FG^{ewd}$ as described herein. In yet other embodiments, an ERL can have an aromatic core consisting of a phenyl group fused to a cycloheteroalkyl group comprising at least one of —C(O)—, —SO$_2$—, and —CF$_2$— in the ring, wherein the cycloheteroalkyl group can be one of:

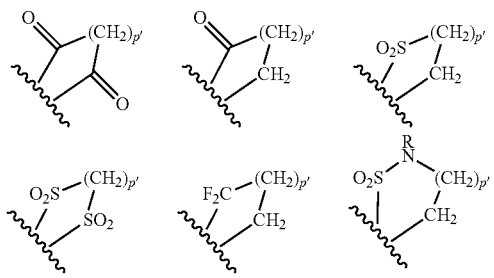

where R is H or a $C_{1-6}$ alkyl group; and p' is 1 or 2.

In some embodiments, the OSC can have satisfactory solubility in the first liquid, in which case, the first liquid can be the only liquid in the liquid medium. As used herein, an OSC can be considered soluble in a liquid when at least about 0.1 mg of the OSC can be dissolved in about 1 mL of the liquid at about 1 atm at a temperature of about 50° C. or less. In other embodiments, in spite of whether the OSC has satisfactory solubility (>0.1 mg/mL) in the first liquid, the present formulation optionally can include a second liquid that functions as a solvent for the OSC. For example, the OSC can have a solubility that is >>0.1 mg/mL in the second liquid. Preferably, the second liquid also is miscible with the first liquid. The second liquid can be a single solvent or a solvent mixture including two or more solvents. Examples of common organic solvents that may be used as the second liquid according to the present teachings include, but are not limited to, petroleum ethers; acetonitrile; ENLs such as benzene, toluene, o-xylene, m-xylene, p-xylene, chlorobenzene, 1,2-dichlorobenzene, 1,3-dichlorobenzene, 1,2,4-trichlorobenzene, 4-chlorotoluene, chlorobenzene, 2-chlorotoluene, cyclohexylbenzene, 1-methyl naphthalene, 2-methylnapthalene, 1-ethyl naphthalene, 2-ethyl napthalene, 1,2,4-trimethylbenzene, mesitylene, tetraline, indane, indene, fluorobenzene, 1,2-difluorobenzene, 1,3-difluorobenzene, 1,4-difluorobenzene, 1-chloronaphthalene, 2-chloronaphthalene, 1-fluoronaphthalene, and 2-fluoronaphthalene; ketones such as acetone, and methyl ethyl ketone; ethers such as tetrahydrofuran, dioxane, bis(2-methoxyethyl) ether, diethyl ether, di-isopropyl ether, and t-butyl methyl ether; alcohols such as methanol, ethanol, butanol, and isopropyl alcohol; aliphatic hydrocarbons such as hexanes; esters such as methyl acetate, ethyl acetate, methyl formate, ethyl formate, isopropyl acetate, and butyl acetate; amides such as dimethylformamide and dimethylacetamide; sulfoxides such as dimethylsulfoxide; halogenated aliphatic hydrocarbons such as dichloromethane, chloroform, ethylene chloride; and cyclic solvents such as cyclopentanone, cyclohexanone, and 2-methypyrrolidone. In preferred embodiments, the second liquid can include one or more electron-neutral liquids. In particular embodiments, the electron-neutral liquid can be a non-halogenated aromatic solvent selected from benzene, toluene, o-xylene, m-xylene, p-xylene, cyclohexylbenzene, 1-methyl naphthalene, 2-methylnaphthalene, 1-ethyl naphthalene, 2-ethylnapthalene, 1,2,4-trimethylbenzene, mesitylene, tetraline, indane, and indene.

In embodiments where the formulation comprises a first liquid and a second liquid in the liquid medium, the first liquid can be present in an amount of at least about 5 vol % and up to about 95 vol % of the total volume of the liquid medium, and the second liquid can be present in an amount of about 5 vol % and up to about 95 vol % of the total volume of the formulation. In preferred embodiments, the first liquid can be present in an amount of at least about 10 vol % and up to about 50 vol % of the total volume of the liquid medium, and the second liquid can be present in an amount of about 50 vol % and up to about 90 vol % of the total volume of the formulation. The OSC generally is present at less than or about a 1:1 molar ratio relative to the first liquid.

In some embodiments, the present formulation can further include one or more additives independently selected from viscosity modulators, detergents, dispersants, binding agents, compatiblizing agents, curing agents, initiators, humectants, antifoaming agents, wetting agents, pH modifiers, biocides, and bactereriostats. For example, surfactants and/or polymers (e.g., polystyrene, polyethylene, poly-alpha-methyl styrene, polyisobutene, polypropylene, polymethylmethacrylate, polynorbornene, polysulfone, poly(p-phenyleneoxide), polycarbazole, polytriarylamine, polyfluorene, polyphenylene and the like) can be included as a dispersant, a binding agent, a compatibilizing agent, and/or an antifoaming agent. For example, the present formulation can include a polymeric additive, where the weight ratio of the OSC to the polymeric additive is in the range of 0.02:1 to 50:1, preferably in the range of 0.1:1 to 10:1, and more preferably in the range of 0.2:1 to 5:1.

In preferred embodiments, the present formulation can include an aromatic compound as an additive, regardless of its physical state, and whether it may be considered electron-rich, electron-poor, or electron-neutral. Examples of such aromatic additives can include, without limitation, 1,4-dichlorobenzene, 1,3,5-trichlorobenzene, naphthalene, phenanthrene, 1,2,3,4,5,6,7,8-octahydroanthracene, 9H-fluorene, 9,9-dimethylfluorene, 1,5-dimethylnaphthalene, 1,5-diethylnaphthalene, 2,6-dimethylnaphthalene, 2,6-diethylnaphthalene, 1,4-dimethylnaphthalene, 1,4-diethylnaphthalene, anthracene, 2-methylanthracene, 1-methylanthracene, 9-methylanthracene, dimethylanthracene, 1,2,3,4,5,6,7,8,9,10,11,12-dodecahydrotriphenylene, 1,2-dihydroacenaphthylene, pyrene, 1-methylpyrene, 2-methylpyrene, 4-pyrene, perylene, 1-methylperylene, 2-methylperylene, 3-methylperylene, biphenyl, 4,4'-dimethyl-1,1'-biphenyl, 3,3'-dimethyl-1,1'-biphenyl, 2,2'-dimethyl-1,1'-biphenyl, 4-methyl-1,1'-biphenyl, 3-methyl-1,1'-biphenyl, 2-methyl-1,1'-biphenyl, 2-fluoroanthracene, 1-fluoroanthracene, 9-fluoroanthracene, difluoroanthracene, 1-fluoropyrene, 2-fluoropyrene, 4-fluoropyrene, 1-fluoroperylene, 2-fluoroperylene, 3-fluoroperylene, 4,4'-difluoro-1,1'-biphenyl, 3,3'-difluoro-1,1'-biphenyl, 2,2'-difluoro-1,1'-biphenyl, 4-fluoro-1,1'-biphenyl, 3-fluoro-1,1'-biphenyl, 2-fluoro-1,1'-biphenyl, and 4-methoxy-1-naphthonitrile. The aromatic additive can be present relative to the OSC at a weight ratio in the range of 0.02:1 to 50:1, preferably in the range of 0.1:1 to 10:1, and more preferably in the range of 0.2:1 to 5:1.

In one aspect, the present teachings relate to n-type organic semiconductor formulations. Various n-type organic semiconducting compounds are known in the art and can be formulated with a first liquid (i.e., an ERL), an optional second liquid (i.e., a solvent or solvent mixture), and any optional additives according to the present teachings.

One class of n-type OSCs relates to thiophene oligomers substituted with fluorocarbons. For example, α,ω-diperfluorohexylsexithiophenes and other fluorocarbon-substituted thiophene oligomers are described in U.S. Pat. No. 6,585,914.

Another class of n-type OSCs relates to fused ring tetracarboxylic diimides and their derivatives. For example, cyanated perylene diimides and cyanated naphthalene diimides, more specifically, N,N'-bis-substituted-(1,7 & 1,6)-dicyano-perylene-3,4:9,10-bis(dicarboximide)s and N,N'-bis-substituted 2,6-dicyanonaphthalene-1,4,5,8-bis(dicarboximide)s such as those described in U.S. Pat. Nos. 7,671,202, 7,902,363, and 7,569,693, and U.S. Patent Application Publication No. 2010/0319778 have been used as n-type semiconductors. Specific examples include N,N'-bis(cyclohexyl)-(1,7 & 1,6)-dicyano-perylene-3,4:9,10-bis(dicarboximide) ($CN_2PDI$); N,N'-bis(1H-perfluorobutyl)-(1,7 & 1,6)-di-cyano-perylene-3,4:9,10-bis(dicarboximide); N,N'-bis(n-octyl)-(1,7 & 1,6)-di-cyano-perylene-3,4:9,10-bis(dicarboximide) (PDI-$8CN_2$); N,N'-bis(n-octyl)-2,6-dicyanonaphthalene-1,4,5,8-bis(dicarboximide) (NDI-$8CN_2$); N,N'-bis(2-methylhexyl)-(1,7 & 1,6)-dicyanoperylene-3,4:9,10-bis(dicarboximide); N,N'-bis(2-ethylhexyl)-(1,7 & 1,6)-dicyanoperylene-3,4:9,10-bis(dicarboximide); N,N'-bis[(3S)-3,7-dimethyl-6-octenyl]-(1,7 & 1,6)-dicyanoperylene-3,4:9,10-bis(dicarboximide); N,N'-bis(4-n-hexylphenyl)-(1,7 & 1,6)-dicyanoperylene-3,4:9,10-bis(dicarboximide); N,N'-bis(4-n-dodecylphenyl)-(1,7 & 1,6)-dicyanoperylene-3,4:9,10-bis(dicarboximide); N,N'-bis{4-[(3S)-3,7-dimethyl-6-octenyl]phenyl}-(1,7 & 1,6)-dicyanoperylene-3,4:9,10-bis(dicarboximide); N,N'-bis(4-heptyloxyphenyl)-(1,7 & 1,6)-dicyanoperylene-3,4:9,10-bis(dicarboximide); N,N'-bis(4-biphenylyl)-(1,7 & 1,6)-dicyanoperylene-3,4:9,10-bis(dicarboximide); N,N'-bis[4-(4'-n-octylbiphenylyl)]-(1,7 & 1,6)-dicyanoperylene-3,4:9,10-bis(dicarboximide); N,N'-bis{4-[4'-((3S)-3,7-dimethyl-6-octenyl]biphenylyl}-(1,7 & 1,6)-dicyanoperylene-3,4:9,10-bis(dicarboximide); N,N'-bis

[4-(2',3',4',5',6'-pentafluorobiphenyl)]-(1,7 & 1,6)-dibromoperylene-3,4:9,10-bis(dicarboximide); N,N'-bis[4-(4'-n-octyl-2',3',5',6'-tetrafluorobiphenyl)]-(1,7 & 1,6)-dicyanoperylene-3,4:9,10-bis(dicarboximide); N,N'-bis[4-(4'-n-octyl-2,3,5,6-tetrafluorobiphenyl)]-(1,7 & 1,6)-dicyanoperylene-3,4:9,10-bis(dicarboximide); N,N'-bis(benzyl)-(1,7 & 1,6)-dicyanoperylene-3,4:9,10-bis(dicarboximide); N,N'-bis(4-n-butylbenzyl)-(1,7 & 1,6)-dicyanoperylene-3,4:9,10-bis(dicarboximide); N,N'-bis(4-sec-butylphenyl)-(1,7 & 1,6)-dicyanoperylene-3,4:9,10-bis(dicarboximide); N,N'-bis{4-[(3S)-3,7-dimethyl-6-octenyloxy]benzyl}-(1,7 & 1,6)-dicyanoperylene-3,4:9,10-bis(dicarboximide); N,N'-bis(4-benzylphenyl)-(1,7 & 1,6)-dicyanoperylene-3,4:9,10-bis(dicarboximide); N,N'-bis{4-[1-(2-phenylethyl)]phenyl}-(1,7 & 1,6)-dicyanoperylene-3,4:9,10-bis(dicarboximide); N,N'-bis(4-n-benzoylphenyl)-(1,7 & 1,6)-dicyanoperylene-3,4:9,10-bis(dicarboximide); N,N'-bis(1-methylbutyl)-(1,7 & 1,6)-dicyanoperylene-3,4:9,10-bis(dicarboximide); N,N'-bis(1-methylpentyl)-(1,7 & 1,6)-dicyanoperylene-3,4:9,10-bis(dicarboximide); N,N'-bis(1-methylhexyl)-(1,7 & 1,6)-dicyanoperylene-3,4:9,10-bis(dicarboximide); N,N'-bis(1-ethylpropyl)-(1,7 & 1,6)-dicyanoperylene-3,4:9,10-bis(dicarboximide); N,N'-bis(1-ethylbutyl)-(1,7 & 1,6)-dicyanoperylene-3,4:9,10-bis(dicarboximide); N,N'-bis(1-ethylpentyl)-(1,7 & 1,6)-dicyanoperylene-3,4:9,10-bis(dicarboximide); N,N'-bis(1-ethylhexyl)-(1,7 & 1,6)-dicyanoperylene-3,4:9,10-bis(dicarboximide); and N,N'-bis(1,3-dimethylbutyl)-(1,7 & 1,6)-dicyanoperylene-3,4:9,10-bis(dicarboximide).

More recently, hybrid perylene/naphthalene diimides, pi-bridge linked dimeric naphthalene diimides, and large disc-like ovalene diimides (with optional cyano substituents) have been reported as n-type semicondutors. See Yue et al., "Hybrid Rylene Arrays via Combination of Stille Coupling and C—H Transformation as High-Performance Electron Transport Materials," *J. Am. Chem. Soc.* (2012); Hwang et al., "Stable Solution-Processed Molecular n-Channel Organic Field-Effect Transistors," *Adv. Mater.* (2012) and Polander et al., "Solution-Processed Molecular Bis (Naphthalene Diimide) Derivatives with High Electron Mobility," *Chem. Mater.*, 23: 3408-3410 (2011); Li et al., "Disc-like 7,14-dicyano-ovalene-3,4:10,11-bis(dicarboximide) as a solution-processible n-type semiconductor for air stable field-effect transistors," *Chem. Sci.*, 3: 846-850 (2012). Naphthalene diimides fused with 2-(1,3-dithiol-2-ylidene) malonitrile groups also have been reported as n-type semiconductors. See Gao et al., "Core-Expanded Naphthalene Diimides Fused with 2-(1,3-Ditiol-2-Ylidene)Malonitrile Groups for High-Performance Ambient-Stable, Solution-Processed n-Channel Organic Thin Film Transistors," *J. Am. Chem. Soc.*, 132(11): 3697-3699 (2010).

Another class of n-type semiconductors relates to dicyanomethylene-substituted conjugated systems. For example, U.S. Pat. No. 7,928,249 describes dicyanomethylene-substituted fused ring compounds such as 2,8-di-(3-dodecylthien-2-yl)-indeno[1,2-b]fluorene-6,12-dimalonitrile; 2,8-dithien-2-yl-tetraphenylenedimalonitrile; and 2,8-di-(4'-dodecylthien-2'-yl]-4-dodecylthien-2-yl)-indeno[1,2-b]fluorene-6,12-dimalono-nitrile. Dicyanomethylene-substituted diketopyrrolopyrrole-containing quinoidal small molecules also have been investigated as n-type semiconductors. See Qiao et al., "Diketopyrrolopyrrole-Containing Quinoidal Small Molecules for High-Performance, Air-Stable, and Solution-Processable n-Channel Organic Field-Effect Transistors," *J. Am. Chem. Soc.*, 134: 4084-4087 (2012).

Thionated aromatic bisimides also can be used as n-type semiconductors. Examples include those described in International Publication Nos. WO2011/082234 such as (S,S)-PDIS$_1$1MP, (S,S)-cis-PDIS$_2$1MP, (S,S)-trans-PDIS$_2$1MP, (S,S)-PDIS$_3$1MP, (S,S)-PDIS$_4$1MP, (S,S)-trans-PDIS$_2$1MHex, (R,R)-trans-PDIS$_2$1MHex, (S,R)-trans-PDIS$_2$1MHex, (R,S)-trans-PDIS$_2$1MHex, (R,R)-trans-PDIS$_2$1MHept, (S,S)-trans-PDIS$_2$1MO, trans-PDIS$_2$1EPr, cis-PDIS$_2$1EPr, trans-PDIS$_2$1M3MB, trans-PDIS$_2$2OD, trans-PDIS$_2$1MP-CN$_2$, cis-NDIS$_2$Cy, trans-NDIS$_2$Cy, NDIS$_1$2EH, trans-NDIS$_1$2EH, cis-NDIS$_1$2EH, NDIS$_3$2EH, SPDI-F, trans-PDIS$_2$1MP-F$_2$, and S—C2OD-C6$_2$.

N-type semiconducting polymers also can be formulated according to the present teachings. Examples of n-type semiconducting polymers include those described in U.S. Patent Application Publication No. US 2010/0326527 such as poly{N,N'-bis(2-ethylhexyl)-1,4,5,8-naphthalene diimide-2,6-diyl]-alt-5,5'-(2,2'-bithiophene)}; poly{N,N'-bis(2-ethylhexyl)-1,4,5,8-naphthalene diimide-2,6-diyl]-alt-5,5'-(2,5-thiophene)}; poly{N,N'-bis(2-octyldodecyl)-1,4,5,8-naphthalene diimide-2,6-diyl]-alt-5,5'-(2,2'-bithiophene)}; poly{N,N'-bis(1-methylhexyl)-1,4,5,8-naphthalene diimide-2,6-diyl]-alt-5,5'-(2,2'-bithiophene)}; poly{N,N'-bis(2-octyldodecyl)-1,4,5,8-naphthalene diimide-2,6-diyl]-alt-5,5'''-(quarterthiophene)}; poly{N,N'-bis(2-octyldodecyl)-1,4,5,8-naphthalene diimide-2,6-diyl]-alt-5,5'-(2,2'-bithiazole)}; poly {N,N'-bis(2-octyldodecyl)-1,4,5,8-naphthalene diimide-2,6-diyl]-alt-5,5'-(4',7'-di-2-thienyl-2',1',3',-benzothiadiazole)}; poly{N,N'-bis(2-octyldodecyl)-1,4,5,8-naphthalene diimide-2,6-diyl]-alt-5,5'-(1',4'-di-2-thienyl-2',3',5',6'-tetrafluorobenzene)}; poly{N,N'-bis(2-octyldodecyl)-1,4,5,8-naphthalene diimide-2,6-diyl]-alt-5,5'-(1,2-bis(2'-thienyl)vinyl)}; poly{N,N'-bis(2-octyldodecyl)-1,4,5,8-naphthalene diimide-2,6-diyl]-alt-5,5'-(2,6-bis(2'-thienyl)naphthalene)}; and poly{N,N'-bis(2-octyldodecyl)-1,4,5,8-naphthalene diimide-2,6-diyl]-alt-5,5'-(1,1'-dimethyl-2,2'-bipyrrole)}.

Accordingly, in some embodiments, the present formulation can include an n-type OSC selected from any of the small-molecule and polymeric n-type OSCs described above, a first liquid that is an electron-rich liquid as defined herein, and optionally, a second liquid in which the n-type OSC has a solubility of at least about 0.1 mg/mL.

In certain embodiments, the first liquid can be an electron-rich liquid that is an aniline-based compound. Examples of aniline-based compounds including aniline; alkyl-substituted anilines such as p-toluidine, m-toluidine, o-toluidine, 2-ethylaniline, 3-ethylaniline, and 4-ethylaniline; alkoxy-substituted anilines and alkylthio-substitued anilines such as 2-methoxyaniline, 3-methoxyaniline, 4-methoxyaniline, 2-methylthioaniline, 3-methylthioaniline, and 4-methylthioaniline; halo-substituted anilines such as 2-chloroaniline, 3-chloroaniline, 4-chloroaniline, 2-fluoroaniline, 3-fluoroaniline, and 4-fluoroaniline; secondary (N-substituted) anilines such as ethylphenylamine and N-methylaniline; tertiary (N,N-disubstituted) anilines such as N,N-dimethylaniline, N,N-dimethyl-2-methylaniline, N,N-dimethyl-3-methylaniline, N,N-dimethyl-4-methylaniline, N,N-dimethyl-4-methoxyaniline, N,N-dimethyl-3-methoxyaniline, N,N-dimethyl-2-methoxyaniline, N,N-dimethyl-3-methylthioaniline, N,N-dimethyl-4-methylthioaniline, N,N-dimethyl-2-methylthioaniline, N,N-dimethyl-2-chloroaniline, N,N-dimethyl-3-chloroaniline, N,N-dimethyl-4-chloroaniline, N,N-diethylaminobenzene, 2-methoxy-N,N-diethylaniline, N-ethyl-N-methylaniline, N,N-dimethyl-o-toluidine, N,N-dimethyl-m-toluidine, N,N-dimethyl-p-toluidine; N-hydroxyethylanilines such as N-phenyldiethanolamine, N-ethyl-N-hydroxyethylaniline, 2-(methylphenylamino)ethanol, 2-[methyl(2-methylphenyl) amino]-ethanol, 2-[methyl(3-methylphenyl)amino]-ethanol, 2-[methyl(4-methylphenyl)amino]-ethanol, N-hydroxyethylaniline ethanol, 2-[methyl(2-methoxyphenyl)amino]-ethanol, 2-[methyl(3-methoxyphenyl)amino]-ethanol, and 2-[methyl(4-methoxyphenyl)amino]-ethanol, 1-(methyl (phenyl)amino)ethanol, 1-(ethyl(phenyl)amino)ethanol, 1-(methyl(phenyl)amino)propan-2-ol, 1-(ethyl(phenyl) amino)propan-2-ol; N-ether anilines such as N-(2-methoxyethyl)aniline, N-(methoxymethyl)-N-methylaniline, and N-(2-methoxyethyl)-N-methylaniline, N-(2-ethoxyethyl)-N-methylaniline, N-(2-methoxyethyl)-N-ethylaniline, N-(2-ethoxyethyl)-N-ethylaniline; N-amino anilines such as phenyl hydrazine, o-tolylhydrazine, m-tolylhydrazine, p-tolylhydrazine, (4-methoxy-phenyl)-hydrazine, (3-methoxy-phenyl)-hydrazine, and (2-methoxy-phenyl)-hydrazine.

In certain embodiments, the first liquid can be an electron-rich liquid that is a benzene-based alcohol, where the phenyl group can be directly substituted with a hydroxyl group, or the phenyl group can be substituted with an alkyl, alkoxy, alkylthio, or amino group, wherein the alkyl, alkoxy, alkylthio, or amino group is substituted with a hydroxyl group. In addition to the alcohol group, the phenyl group optionally can be substituted with one or more additional FGs and/or FG$^{ed}$s. Examples of benzene-based alcohols include phenol; cresol (o-cresol, m-cresol, p-cresol); 2-methoxyphenol, 3-methoxyphenol, 4-methoxyphenol, 4-aminobenzylalcohol; 2-phenoxyethanol; 3-phenoxy-1-propanol; 4-phenoxy-1-butanol; 5-phenoxy-1-heptanol; 6-phenoxy-1-hexanol; 2-(2-methylphenoxy)ethan-1-ol; 2-(3-methylphenoxy) ethan-1-ol; 2-(4-methylphenoxy)ethan-1-ol; phenoxymethanol; 1-phenoxyethanol, 1-phenoxypropanol, 1-phenoxybutanol, 2-(2-methoxyphenoxy)ethan-1-ol, 2-(3-methoxyphenoxy)ethan-1-ol; 2-(4-methoxyphenoxy)ethan-1-ol; 2-(2-methylphenoxy)ethanol, 2-(3-methylphenoxy) ethanol, 2-(4-methylphenoxy)ethanol, 2-(4-methoxyphenoxy)ethanol, 2-(3-methoxyphenoxy)ethan-1-ol, 2-(2-methoxyphenoxy)ethan-1-ol, 3-(phenylsulfanyl)propan-1-ol, 2-phenylthioethanol, and phenylsulfanylmethanol; as well as the various N-hydroxyethylanilines exemplified above.

In certain embodiments, the first liquid can be an electron-rich liquid that is an anisole-based compound, an alkoxy-substituted benzene compound, or a polyether-substituted benzene compound such as anisole, 2-chloroanisole, 3-chloroanisole, 4-chloroanisole, 4-fluoroanisole, 3-fluoroanisole, 2-fluoroanisole, ethoxybenzene, propoxybenzene, butoxybenzene, 4-methylanisole, 3-methylanisole, 2-methylanisole, 2-ethylanisole, 3-ethylanisole, 4-ethylanisole, 2,3-dimethylanisole, 2,4-dimethylanisole, 2,5-dimethylanisole, 2,6-dimethylanisole, 3,4-dimethylanisole, 3,5-dimethylanisole, 1,2-dimethoxybenzene, 1,3-dimethoxybenzene, 1,4-dimethoxybenzene, 1-ethoxy-4-methoxybenzene, 1-ethoxy-3-methoxybenzene, 1-ethoxy-2-methoxybenzene, 2,3-dimethoxytoluene, 2,4-dimethoxytoluene, 2,5-dimethoxytoluene, 2,6-dimethoxytoluene, 3,4-dimethoxytoluene, 3,5-dimethoxytoluene, 4-ethoxytoluene, 3-ethoxytoluene, 2-ethoxytoluene, 1-ethoxy-2-ethylbenzene, 1-ethoxy-3-ethylbenzene, 1-ethoxy-4-ethylbenzene, 1-(methoxymethoxy)benzene, (2-methoxyethoxy)benzene, and (3-methoxypropoxy)benzene.

In certain embodiments, the first liquid can be an electron-rich liquid that is a thiophenol-based compound or an alkylthio-substituted benzene compound. Examples of thiophenols include thiophenol, 2-thiocresol, 3-thiocresol, 4-thiocresol, 2-ethyl thiophenol, 3-ethyl thiophenol, 4-ethyl thiophenol, 2,6-dimethylthiophenol, 2,5-dimethylthiophenol, 2,4-dimethylthiophenol, 2,3-dimethylthiophenol, and 2-isopropylthiophenol. Examples of alkylthio-substituted benzenes include thioanisole, (ethylthio)benzene, 2-methylthioanisole, 3-methyl thioanisole, 4-methyl thioanisole, 4-methoxy thioanisole, 3-methoxy thioanisole, 2-methoxy thioanisole, In certain embodiments, the first liquid can be an electron-rich liquid that is an optionally substituted phenyl acetate or an optionally substituted phenyl formate. Examples of substituted phenyl acetates and phenyl formats include o-cresol acetate, p-cresol acetate, m-Cresol acetate, 2-methoxyphenyl acetate, 3-methoxyphenyl acetate, and 4-methoxyphenyl acetate.

In certain embodiments, the first liquid can be an electron-rich liquid that is a phenylphosphine such as phosphaniline, dimethylphenylphosphine, diethylphenylphosphine, and dimethyl(4-methylphenyl)phosphine.

In certain embodiments, the first liquid can be an electron-rich liquid that is an electron-rich aromatic compound comprising a phenyl group fused to a 5-, 6-, or 7-membered cycloheteroalkyl group. Examples include indoline and substituted indolines such as 7-methylindoline, 5-methylindoline, and 6-methylindoline; 1,2,3,4-tetrahydroquinoline; 6-methyl-3,4-dihydro-2H-1-benzopyran; benzodioxole and substituted benzodioxoles such as 1,3-benzodioxole, 2-methyl-1,3-benzodioxole, 2-ethyl-1,3-benzodioxole, 5-hydroxy-1,3-benzodioxole, 5-methyl-1,3-benzodioxole, 5-methoxy-1,3-benzodioxole, 5-methyl-1,3-benzodioxole, 5-ethyl-1,3-benzodioxole, 4-hydroxy-1,3-benzodioxole, 4-methyl-1,3-benzodioxole, 4-ethyl-1,3-benzodioxole, 4-methoxy-1,3-benzodioxole, 2,2-dimethyl-1,3-benzodioxole, 3,4-methylenedioxytoluene, and 4-methyl-2H-1,3-benzodioxole; dihydrobenzofuran and substituted dihydrobenzofurans such as 2,3-dihydrobenzofuran, 2,3-dihydro-2-methylbenzofuran, 6-methyl-2,3-dihydrobenzofuran, and 5-methyl-2,3-dihydrobenzofuran; 4H-chromene, chromane, 7-methylchroman, 8-methylchroman, and 2,3-dihydrobenzo[b]thiophene.

In certain embodiments, the first liquid can be an electron-rich liquid that is a naphthalene-based compound such as 1-methoxynaphthalene, 2-methoxynaphthalene, 1-ethoxynaphthalene, 2-ethoxynaphthalene, 2-(methylthio) naphthalene, 1-(methylthio)naphthalene, N,N-dimethyl-1-naphthylamine, 2-dimethylaminonaphthalene, 1-methoxy-5-methylnaphthalene, 6-methoxy-1-methylnaphthalene, 7-methoxy-1-methylnaphthalene, or 1-methoxy-8-methylnaphthalene. In some embodiments, the first liquid can be a partially hydrogenated naphthalene-based compound such as tetralin, 5-methoxy-1,2,3,4-tetrahydronaphthalene, 6-methoxy-1,2,3,4-tetrahydronaphthalene, N,N-dimethyl-5,6,7,8-tetrahydronaphthalen-2-amine, 5,6,7,8-tetrahydronaphthalene-1-thiol, N,N-dimethyl-5,6,7,8-tetrahydronaphthalen-1-amine, 5,6,7,8-tetrahydro-1-naphthol, and 5,6,7,8-tetrahydro-2-naphthalenol.

In certain embodiments, the first liquid can be an electron-rich liquid that is an indane-based compound such as indane, 5-methoxyindane, 4-methoxy-2,3-dihydro-1H-indene, N,N-dimethyl-2,3-dihydro-1H-inden-4-amine, N,N-dimethyl-2,3-dihydro-1H-inden-5-amine, 4-indanol, and 5-indanol.

In certain embodiments, the first liquid can be an electron-rich liquid that is a carbazole or a substituted carbazole such as N-ethylcarbazole, N-methylcarbazole, 1-methyl-carbazole, 2-methyl-carbazole, 3-methyl-carbazole, 4-methyl-carbazole, 1-ethyl-carbazole, 2-ethyl-carbazole, 3-ethyl-carbazole, 4-ethyl-carbazole, 1-methoxy-carbazole, 2-methoxy-carbazole, 3-methoxy-carbazole, 4-methoxycarbazole, 1-ethoxy-carbazole, 2-ethoxy-carbazole, 3-ethoxy-carbazole, 4-ethoxy-carbazole, 1-methyl-N-methyl-carbazole, 2-methyl-N-methyl-carbazole, 3-methyl-N-methyl-carbazole, 4-methyl-N-methyl-carbazole, 1-ethyl-N-methyl-carbazole, 2-ethyl-N-methyl-carbazole, 3-ethyl-N-methyl-carbazole, 4-ethyl-N-methyl-carbazole, 1-methoxy-N-methyl-carbazole, 2-methoxy-N-methyl-carbazole, 3-methoxy-N-methyl-carbazole, 4-methoxy-N-methyl-carbazole, 1-ethoxy-N-methyl-carbazole, 2-ethoxy-N-methyl-carbazole, 3-ethoxy-N-methyl-carbazole, 4-ethoxy-N-methyl-carbazole, 1-methyl-N-ethyl-carbazole, 2-methyl-N-ethyl-carbazole, 3-ethyl-N-methyl-carbazole, 4-methyl-N-ethyl-carbazole, 1-ethyl-N-ethyl-carbazole, 2-ethyl-N-ethyl-carbazole, 3-ethyl-N-ethyl-carbazole, 4-ethyl-N-ethyl-carbazole, 1-methoxy-N-ethyl-carbazole, 2-ethoxy-N-ethyl-carbazole, 3-methoxy-N-ethyl-carbazole, 4-methoxy-N-ethyl-carbazole, 1-ethoxy-N-ethyl-carbazole, 2-ethoxy-N-ethyl-carbazole, 3-ethoxy-N-ethyl-carbazole, and 4-ethoxy-N-ethyl-carbazole.

In certain embodiments, the first liquid can be an electron-rich liquid that is an electron-rich 5-membered heteroaryl compound or a benzo-fused compound thereof such as thiophene, 2-methylthiophene, 3-methylthiophene, furan, 3-methylfuran, 2-methylfuran, pyrrole, N-methylpyrrole, N-ethylpyrrole, 1,2-dimethyl-1H-pyrrole, 1,3-dimethyl-1H-pyrrole, 2-methoxyfuran, 3-methoxyfuran, 3-methoxythiophene, 2-methoxythiophene, 2-methylthiofuran, 3-methylthiofuran, 3-methylthiothiophene, 2-methylthiothiophene, 2-N,N-dimethylamino-thiophene, 3-methoxy-1-methyl-1H-pyrrole, 2-methoxy-1-methyl-1H-pyrrole, benzofuran, 6-methylbenzofuran, benzothiophene, and 6-methylbenzothiophene.

In certain embodiments, the first liquid can be an electron-rich liquid that is an electron-rich thieno-fused compound such as thieno[3,2-b]thiophene, 2-methyl-thieno[3,2-b]thiophene, 3-methyl-thieno[3,2-b]thiophene, 2-methoxy-thieno[3,2-b]thiophene, 3-methoxy-thieno[3,2-b]thiophene, 2-hydroxy-thieno[3,2-b]thiophene, 3-hydroxy-thieno[3,2-b]thiophene, 2-ethyl-thieno[3,2-b]thiophene, 3-ethyl-thieno[3,2-b]thiophene, 3,4-ethylenedioxythiophene, 3,4-dimethoxythiophene, and 3,4-dihydro-2H-thieno[3,4-b][1,4]dioxepin.

In preferred embodiments, an n-type semiconductor formulation according to the present teachings can include an n-type semiconductor in a liquid medium comprising at least an electron-rich liquid selected from an aniline-based compound, a benzene-based alcohol (e.g., a phenyl group substituted with an alkyl, alkoxy, alkylthio, or amino group, wherein the alkyl, alkoxy, alkylthio, or amino group is substituted with a hydroxyl group), an optionally substituted indoline, an optionally substituted benzodioxole, an optionally substituted dihydrobenzofuran, an optionally substituted chromane, and a naphthalene compound substituted with one or more electron-donating groups. In particular embodiments, the liquid medium can further include at least one of an aromatic additive and a second liquid comprising an electron-neutral liquid. For example, the second liquid can comprise an electron-neutral liquid selected from benzene, toluene, o-xylene, m-xylene, p-xylene, chlorobenzene, 1,2-dichlorobenzene, 1,3-dichlorobenzene, 1,2,4-trichlorobenzene, 4-chlorotoluene, 3-chlorobenzene, 2-chlorotoluene, cyclohexylbenzene, 1-methyl naphthalene, 2-methylnapthalene, 1-ethyl naphthalene, 2-ethylnapthalene, 1,2,4-trimethylbenzene, mesitylene, tetraline, indane, indene, fluorobenzene, 1,2-difluorobenzene, 1,3-difluorobenzene, 1,4-difluorobenzene, 1-chloronaphthalene, 2-chloronaphthalene, 1-fluoronaphthalene, and 2-fluoronaphthalene. The aromatic additive can be selected from 1,4-dichlorobenzene, 1,3,5-trichlorobenzene, naphthalene, phenanthrene, 1,2,3,4,5,6,7,8-octahydroanthracene, 9H-fluorene, 9,9-dimethylfluorene, 1,5-dimethylnaphthalene, 1,5-diethylnaphthalene, 2,6-dimethylnaphthalene, 2,6-diethylnaphthalene, 1,4-dimethylnaphthalene, 1,4-diethylnaphthalene, anthracene, 2-methylanthracene, 1-methylanthracene, 9-methylanthracene, dimethylanthracene, 1,2,3,4,5,6,7,8,9,10,11,12-dodecahydrotriphenylene, 1,2-dihydroacenaphthylene, pyrene, 1-methylpyrene, 2-methylpyrene, 4-methylpyrene, perylene, 1-methylperylene, 2-methylperylene, 3-methylperylene, biphenyl, 4,3'-dimethyl-1,1'-biphenyl, 3,3'-dimethyl-1,1'-biphenyl, 2,2'-dimethyl-1,1'-biphenyl, 4-methyl-1,1'-biphenyl, 3-methyl-1,1'-biphenyl, 2-methyl-1,1'-biphenyl, 2-fluoroanthracene, 1-fluoroanthracene, 9-fluoroanthracene, difluoroanthracene, 1-fluoropyrene, 2-fluoropyrene, 4-fluoropyrene, 1-fluoroperylene, 2-fluoroperylene, 3-fluoroperylene, 4,4'-difluoro-1,1'-biphenyl, 3,3'-difluoro-1,1'-biphenyl, 2,2'-difluoro-1,1'-biphenyl, 4-fluoro-1,1'-biphenyl, 3-fluoro-1,1'-biphenyl, 2-fluoro-1,1'-biphenyl, and 4-methoxy-1-naphthonitrile.

In another aspect, the present teachings relate to p-type organic semiconductor formulations. Various p-type organic semiconducting compounds are known in the art and can be formulated with a first liquid (i.e., an EPL), an optional second liquid (i.e., a solvent or solvent mixture), and any optional additives according to the present teachings. For example, the p-type OSC can be a soluble pentacene compound such as those described in U.S. Pat. No. 7,125,989. Soluble pentacene compounds, as exemplified by pentacene-N-sulfinyl-tert-butylcarbamate, can be obtained from Diels-Alder reaction of pentacene with hetero dienophiles. Another pentacene derivative, 6,13-bis(triisopropyl-silylethynyl)pentacene (TIPS pentacene), also has been shown to have reasonable solubility in common organic solvents.

Another well-known class of p-type OSC relates to oligothiophenes and polythiophenes. Specific examples include dihexyl quarterthiophene (DH4T) and regioregular poly(3-hexylthiophene) (rr-P3HT).

Further classes of p-type semiconductors include thienocoronene-based compounds described in International Publication No. WO2012/030662. Specific examples include 1PB-thienocoronene, 2BO-thienocoronene, 1MP-thienocoronene, (S)-2MB-thienocoronene, undecanoxy-thienocoronene, and dodecyl-thienocoronene.

More recently, alkylated [1]benzothieno[3,2-b]benzothiophenes and alkylated dinaphtho[2,3-b:2',3'-f]thieno[3,2-b]thiophenes have been reported as highly soluble p-type OSCs. See Ebata, H. et al., "Highly Soluble [1]Benzothieno[3,2-b]benzothiophenes (BTBT) Derivatives for High-Performance, Solution-Processed Organic Field-Effect Transistors," *JACS*, 129(51): 15732-15733 (2007); Ebata, H. et al., "Alkylated Dinaphtho[2,3-b:2',3'-f]Thieno[3,2-b]Thiophenes ($C_n$-DNTTs): Organic Semiconductors for High-Performance Thin-Film Transistors," *Adv. Mat.*, 23(10): 1222-1225 (2011); and co-pending, co-assigned U.S. provisional patent application Ser. No. 61/533,785. Other thienoacene compounds such as dihexyl-substituted dibenzo[d,d']thieno[3,2-b;4,5-b']dithiophene also have been developed as p-type semiconductors. See Miyata et al., "High-performance organic field-effect transistors based on dihexyl-substituted dibenzo[d,d']thieno[3,2-b;4,5-b']dithiophene," *J. Mater. Chem.* (2012). Another class of small molecule p-type OSCs relates to naphtha[2,1-b:6,5-b']difuran: A Versatile Motif Available for Solution-Processed Single-Crystal Organic Field-Effect Transistors with High Hole Mobility," *J. Am. Chem. Soc,* 134: 5448-5451 (2012). Yet another class of small molecule p-type OSCs relates to fluorinated anthradithiophene derivatives. See Subramanian et al., "Chromophore Fluorination Enhances Crystallization and Stability of Soluble Anthradithiophene Semiconductors," *J. Am. Chem. Soc.*, 130(9): 2706-2707 (2008).

Recently, 2-(4-hexylphenylvinyl)anthracene has been reported as a p-type semiconductor with strong solid-state blue emission. See Dadvand et al., "Maximizing Field-Effect Mobility and Solid-State Luminescence in Organic Semiconductors," *Angew. Chem. Int. Ed.*, 51: 3837-3841 (2012);

Further exemplary classes of p-type semiconductors include phthalimide-based polymers, certain diketopyrrolopyrrole-based polymers, isoindigo-based conjugated polymers, See International Publication No. WO2010/117449; Li et al., "A High Mobility P-Type DPP-Thieno[3,2-b] thiophene Copolymer for Organic Thin-Film Transistors," *Adv. Mater.*, 22: 4862-4866 (2010), Li et al., "Annealing-Free High-Mobility Diketopyrrolopyrrole-Quaterthiophene Copolymer for Solution-Processed Organic Thin Film Transistors," *J. Am. Chem. Soc.*, 133: 2198-2204 (2011), Bronstein et al.,"Thieno[3,2-b]thiophene-Diketopyrrolopyrrole-Containing Polymers for High-Performance Organic Field-Effect Transistors and Organic Photovoltaic Devices," *J. Am. Chem. Soc.*, 133: 3272-3275 (2011) and Chen et al., "Highly pi-Extended Copolymers with Diketopyrrolopyrrole Moieties for High-Performance Field-Effect Transistors," *Adv. Mater.* (2012); Mei et al., "Siloxane-Terminated Solubilizing Side Chains: Bringing Conjugated Polymer Backbones Closer and Boosting Hole Mobilities in Thin-Film Transistors," *J. Am. Chem. Soc.*, 133: 20130-20133 (2011) and Lei et al., "High-Performance Air-Stable Organic Field-Effect Transistors: Isoindigo-Based Conjugated Polymers," *J. Am. Chem. Soc.*, 133: 6099-6101 (2011);

Accordingly, in some embodiments, the present formulation can include a p-type OSC selected from any of the small-molecule and polymeric p-type OSCs described above, a first liquid that is an electron-poor liquid as defined herein, and optionally a second liquid in which the p-type OSC has a solubility of at least about 0.1 mg/mL.

In certain embodiments, the first liquid can be an electron-poor liquid that is an aromatic carboxylic acid or ester thereof such as benzoic acid, o-toluic acid, m-toluic acid, p-toluic acid, 4-chlorobenzoic acid, 3-chlorobenzoic acid, 2-chlorobenzoic acid, 2-fluorobenzoic acid, 3-fluorobenzoic acid, 4-fluorobenzoic acid, methyl benzoate, methyl 2-methylbenzoate, methyl 3-methylbenzoate, methyl 4-methylbenzoate, hexylbenzoate, pentylbenzoate, butylbenzoate, propylbenzoate, methyl 2-chlorobenzoate, methyl 3-chlorobenzoate, methyl 4-chlorobenzoate, methyl 4-fluorobenzoate, methyl 3-fluorobenzoate, methyl 2-fluorobenzoate, ethyl benzoate, ethyl 2-methylbenzoate, ethyl 3-methylbenzoate, ethyl 4-methylbenzoate, ethyl 4-chlorobenzoate, ethyl 3-chlorobenzoate, ethyl 2-chlorobenzoate, ethyl 2-fluorobenzoate, ethyl 3-fluorobenzoate, ethyl 4-fluorobenzoate, methyl 4-bromobenzoate, methyl 3-bromobenzoate, and methyl 2-bromobenzoate.

In certain embodiments, the first liquid can be an electron-poor liquid that is an aromatic aldehyde such as benzaldehyde, 2-methylbenzaldehyde, 3-methylbenzaldehyde, 4-methylbenzaldehyde, 4-ethylbenzaldehyde, 3-ethylbenzaldehyde, 2-ethylbenzaldehyde, 2-chlorobenzaldehyde, 3-chlorobenzaldehyde, 4-chlorobenzaldehyde, 4-fluorobenzaldehyde, 3-fluorobenzaldehyde, 2-fluorobenzaldehyde, 2-bromobenzaldehyde, 3-bromobenzaldehyde, and 4-bromobenzaldehyde.

In certain embodiments, the first liquid can be an electron-poor liquid that is an aromatic ketone such as acetophenone, 2-acetyltoluene, 3-acetyltoluene, 4-acetyltoluene, 1-acetyl-4-chlorobenzene, 1-acetyl-3-chlorobenzene, 1-acetyl-2-chlorobenzene, 2-fluoroacetophenone, 3-fluoroacetophenone, 4-fluoroacetophenone, propiophenone, butyrophenone, valerophenone, and hexanophenone.

In certain embodiments, the first liquid can be an electron-poor liquid that is a trifluoromethyl-substituted benzene compound such as benzotrifluoride, 2-methylbenzotrifluoride, 3-methylbenzotrifluoride, 4-methylbenzotrifluoride, 4-chlorobenzotrifluoride, 3-chlorobenzotrifluoride, 2-chlorobenzotrifluoride, 2-fluorobenzotrifluoride, 3-fluorobenzotrifluoride, 4-fluorobenzotrifluoride, 4-bromobenzotrifluoride, 3-bromobenzotrifluoride, 2-bromobenzotrifluoride, methyl 2-trifluoromethylbenzoate, methyl 3-trifluoromethylbenzoate, methyl 4-trifluoromethylbenzoate, ethyl 2-trifluoromethylbenzoate, ethyl 3-trifluoromethylbenzoate, and ethyl 4-trifluoromethylbenzoate.

In certain embodiments, the first liquid can be an electron-poor liquid that is a cyano-substituted or isocyano-substituted benzene compound such as benzonitrile, 2-methylbenzenecarbonitrile, 3-methylbenzenecarbonitrile, 4-methylbenzenecarbonitrile, 4-chlorobenzonitrile, 3-chlorobenzonitrile, 2-chlorobenzonitrile, 2-fluorobenzonitrile, 3-fluorobenzonitrile, 4-fluorobenzonitrile, phenylisocyanide, 2-tolylisocyanide, 3-tolylisocyanide, and 4-tolylisocyanide.

In certain embodiments, the first liquid can be an electron-poor liquid that is a nitro-substituted benzene compound such as nitrobenzene, 2-nitrotoluene, 3-nitrotoluene, 4-nitrotoluene, 1-chloro-4-nitrobenzene, 1-chloro-3-nitrobenzene, 1-chloro-2-nitrobenzene, 1-fluoro-2-nitrobenzene, 1-fluoro-3-nitrobenzene, and 1-fluoro-4-nitrobenzene.

In certain embodiments, the first liquid can be an electron-poor liquid that is a phenyl sulfone such as methyl phenyl sulfone, ethyl phenyl sulfone, (propane-1-sulfonyl)benzene, 1-methanesulfonyl-2-methyl-benzene, 1-methanesulfonyl-3-methyl-benzene, and 1-methanesulfonyl-4-methyl-benzene.

In certain embodiments, the first liquid can be an electron-poor liquid that is an ammonium benzene salt such as aniline hydrochloride and trimethylphenylammonium chloride. In other embodiments, the first liquid can be an electron-poor liquid that is an amido-substituted benzene compound such as N,N-dimethylbenzamide, N-methylbenzamide, and benzamide.

In certain embodiments, the first liquid can be an electron-poor liquid that is a naphthalene compound substituted with at least one $FG^{ewd}$ as described herein. Examples include, 1-trifluoromethyl-naphthalene, 2-(trifluoromethyl)naphthalene, 2-cyanonaphthalene, 1-cyanonaphthalene, 2-naphthaldehyde, 1-naphthaldehyde, 1-(1-naphthalenyl)ethanone, methyl 2-naphthyl ketone, methyl 2-naphthalenecarboxylate, methyl 1-naphthalenecarboxylate, 1-nitronaphthalene, and 2-nitronaphthalene. In certain embodiments, the first liquid can be an electron-poor liquid that is a partially hydrogenated naphthalene compound substituted with at least one $FG^{ewd}$ as described herein. Examples include 5-(trifluoromethyl)-1,2,3,4-tetrahydronaphthalene, 5,6,7,8-tetrahydronaphthalene-2-carbonitrile, 5,6,7,8-tetrahydronaphthalene-1-carbonitrile, 6-nitro-1,2,3,4-tetrahydronaphthalene, 5-nitro-1,2,3,4-tetrahydronaphthalene, methyl 5,6,7,8-tetrahydronaphthalene-1-carboxylate, and methyl 5,6,7,8-tetrahydronaphthalene-2-carboxylate.

In certain embodiments, the first liquid can be an electron-poor liquid that is a 6-membered heteroaryl compound or a benzofused derivative thereof which optionally can be substituted with at least one FG$^{ewd}$ as described herein. Examples include pyridine and substituted pyridines such as 2-methylpyridine, 3-methylpyridine, 4-methylpyridine, 2-chloropyridine, 3-chloropyridine, 4-chloropyridine, 4-fluoropyridine, 3-fluoropyridine, 2-fluoropyridine, 2-bromo-pyridine, 3-bromo-pyridine, 4-bromo-pyridine, 4-(trifluoromethyl)pyridine, 3-(trifluoromethyl)pyridine, 2-(trifluoromethyl)pyridine, 2-cyanopyridine, 3-cyanopyridine, 4-cyanopyridine, 4-nitropyridine, 3-nitropyridine, 2-nitropyridine, 2-picolinic acid methyl ester, 3-picolinic acid methyl ester, and 4-picolinic acid methyl ester; pyrazine and substituted pyrazines such as methyl pyrazine, 2,5-dimethylpyrazine, 2,6-dimethylpyrazine, 2,3-dimethylpyrazine, 2,3,5,6-tetramethyl-pyrazine, 2-chloropyrazine, 2,5-dichloropyrazine, 2,6-dichloropyrazine, 2,3-dichloropyrazine, 2-fluoropyrazine, (trifluoromethyl) pyrazine, 2-pyrazinecarbonitrile, 2-nitro-pyrazine, pyrazine-2-carbaldehyde, 1-pyrazin-2-yl-ethanone, 1-(pyrazin-2-yl) propan-1-one, methyl pyrazine-2-carboxylate, pyrazine 2-carboxylic acid ethyl ester, 2-bromopyrazine, and 2-iodopyrazine; pyridazine and substituted pyridazines such as 3-methylpyridazine, 4-methylpyridazine, 4,5-dimethylpyridazine, 3,6-dimethylpyridazine, 3-chloropyridazine, 4-chloropyridazine, pyridazine-3-carbonitrile, 4-pyridazinecarbonitrile, 4-(trifluoromethyl)pyridazine, 3-(trifluoromethyl)pyridazine, 3-nitropyridazine, pyridazine-3-carbaldehyde, pyridazine-4-carbaldehyde, 1-(pyridazin-4-yl) ethanone, 3-acetylpyridazine, methyl pyridazine-3-carboxylate, and methyl pyridazine-4-carboxylate; tetrazine and substituted tetrazines such as 1,2,4,5-tetrazine, dimethyl-1,2,4,5-tetrazine, and 3,6-dichloro-1,2,4,5-tetrazine; quinoline and substituted quinolones such as 2-methylquinoline, 3-methylquinoline, 4-methylquinoline, 5-methylquinoline, 6-methylquinoline, 7-methylquinoline, 8-methylquinoline, 2-chloroquinoline, 3-chloroquinoline, 4-chloroquinoline, 5-chloroquinoline, 6-chloroquinoline, 7-chloroquinoline, 8-chloroquinoline, 2-fluoroquinoline, 3-fluoroquinoline, 4-fluoroquinoline, 5-fluoroquinoline, 6-fluoroquinoline, 7-fluoroquinoline, 8-fluoroquinoline, 2-trifluoromethyl quinoline, 3-trifluoromethyl quinoline, 4-trifluoromethyl quinoline, 5-trifluoromethyl quinoline, 6-trifluoromethyl quinoline, 7-trifluoromethyl quinoline, 8-trifluoromethyl quinoline, 2-nitroquinoline, 3-nitroquinoline, 4-nitroquinoline, 5-nitroquinoline, 6-nitroquinoline, 7-nitroquinoline, 8-nitroquinoline, 2-acetylquinoline, 3-acetylquinoline, 4-acetylquinoline, 5-acetylquinoline, 6-acetylquinoline, 7-acetylquinoline, 8-acetylquinoline, 2-cyanoquinoline, 3-cyanoquinoline, 4-cyanoquinoline, 5-cyanoquinoline, 6-cyanoquinoline, 7-cyanoquinoline, 8-cyanoquinoline, methyl 2-quinolinecarboxylate, methyl 3-quinolinecarboxylate, methyl 4-quinolinecarboxylate, methyl 5-quinolinecarboxylate, methyl 6-quinolinecarboxylate, methyl 7-quinolinecarboxylate, ethyl 8-quinolinecarboxylate, ethyl 2-quinolinecarboxylate, ethyl 3-quinolinecarboxylate, ethyl 4-quinolinecarboxylate, ethyl 5 quinolinecarboxylate, ethyl 6-quinolinecarboxylate, ethyl 7-quinolinecarboxylate, ethyl 8-quinolinecarboxylate, 2-quinolinecarboxaldehyde, 3-quinolinecarboxaldehyde, 4-quinolinecarboxaldehyde, 5-quinolinecarboxaldehyde, 6-quinolinecarboxaldehyde, 7-quinolinecarboxaldehyde, 8-quinolinecarboxaldehyde, 1-(2-quinolinyl)-ethanone, 1-(3-quinolinyl)-ethanone, 1-(4-quinolinyl)-ethanone, 1-(5-quinolinyl)-ethanone, 1-(6-quinolinyl)-ethanone, 1-(7-quinolinyl)-ethanone, and 1-(8-quinolinyl)-ethanone; quinoxaline and substituted quinoxalines such as 2-methylquinoxaline, 5-methylquinoxaline, 6-methylquinoxaline, 2-chloroquinoxaline, 5-chloroquinoxaline, 6-chloroquinoxaline, 2-fluoroquinoxaline, 5-fluoroquinoxaline, 6-fluoroquinoxaline, 2-cyanoquinoxaline, 5-cyanoquinoxaline, 6-cyanoquinoxaline, 2-nitroquinoxaline, 5-nitroquinoxaline, 6-nitroquinoxaline, 2-trifluoromethylquinoxaline, 5-trifluoromethylquinoxaline, 6-trifluoromethyquinoxaline, methyl 2-quinoxalinecarboxylate, methyl 5-quinoxalinecarboxylate, methyl 6-quinoxalinecarboxylate, ethyl 2-quinoxalinecarboxylate, ethyl 5-quinoxalinecarboxylate, and ethyl 6-quinoxalinecarboxylate.

In certain embodiments, the first liquid can be an electron-poor liquid that is a 5-membered heteroaryl compound having 2, 3 or 4 heteroatoms or a benzofused derivative thereof which optionally can be substituted with at least one FG$^{ewd}$ as described herein. Examples include thiazole and substituted thiazoles such as 2-methylthiazole, 4-methylthiazole, 5-methylthiazole, 2-chlorothiazole, 4-chlorothiazole, 5-chlorothiazole, 2-fluorothiazole, 4-fluorothiazole, 5-fluorothiazole, 2-cyanothiazole, 4-cyanothiazole, 5-cyanothiazole, 2-nitrothiazole, 4-nitrothiazole, 5-nitrothiazole, methyl 1,3-thiazole-2-carboxylate, methyl 1,3-thiazole-5-carboxylate, methyl 1,3-thiazole-6-carboxylate, ethyl 1,3-thiazole-2-carboxylate, ethyl 1,3-thiazole-5-carboxylate, ethyl 1,3-thiazole-6-carboxylate, 2-trifluoromethylthiazole, 4-trifluoromethylthiazole, and 5-trifluoromethylthiazole; imidazole and substituted imidazoles such as N-methyl imidazole, 2-methylimidazole, 4-methylimidazole, 5-methylimidazole, 2-chloroimidazole, 4-chloroimidazole, 5-chloroimidazole, 2-fluoroimidazole, 4-fluoroimidazole, 5-fluoroimidazole, 2-cyanoimidazole, 4-cyanoimidazole, 5-cyanoimidazole, 2-nitroimidazole, 4-nitroimidazole, 5-nitroimidazole, methyl imidazole-2-carboxylate, methyl imidazole-5-carboxylate, methyl imidazole-5-carboxylate, ethyl imidazole-2-carboxylate, ethyl imidazole-4-carboxylate, ethyl imidazole-5-carboxylate, 2-trifluoromethylimidazole, 4-trifluoromethylimidazole, 5-trifluoromethylimidazole, 2-methyl-N-methyl imidazole, 4-methyl-N-methyl imidazole, 5-methyl-N-methyl imidazole, 2-chloro-N-methyl imidazole, 4-chloro-N-methyl imidazole, 5-chloro-N-methyl imidazole, 2-fluoro-N-methyl imidazole, 4-fluoro-N-methyl imidazole, 5-fluoro-N-methyl imidazole, 2-cyano-N-methyl imidazole, 4-cyano-N-methyl imidazole, 5-cyano-N-methyl imidazole, 2-nitro-N-methyl imidazole, 4-nitro-N-methyl imidazole, 5-nitro-N-methyl imidazole, methyl N-methyl imidazole-2-carboxylate, methyl N-methyl imidazole-4-carboxylate, methyl N-methyl imidazole-5-carboxylate, ethyl N-methyl imidazole-2-carboxylate, ethyl N-methyl imidazole-4-carboxylate, ethyl N-methyl imidazole-5-carboxylate, 2-trifluoromethyl-N-methyl imidazole, 4-trifluoromethyl-N-methyl imidazole, and 5-trifluoromethyl-N-methyl imidazole; triazole and substituted triazoles such as 4-methyl-1,2,3-triazole, 5-methyl-1,2,3-triazole, 4-chloro-1,2,3-triazole, 5-chloro-1,2,3-triazole, 4-fluoro-1,2,3-triazole, 5-fluoro-1,2,3-triazole, 4-cyano-1,2,3-triazole, 5-cyano-1,2,3-triazole, 4-nitro-1,2,3-triazole, 5-nitro-1,2,3-triazole, methyl 1,2,3-triazole-4-carboxylate, methyl 1,2,3-triazole-5-carboxylate, ethyl 1,2,3-triazole-4-carboxylate, ethyl 1,2,3-triazole-5-carboxylate, 4-trifluoromethyl-1,2,3-triazole, 5-trifluoromethyl-1,2,3-triazole, 4-methyl-N-methyl-1,2,3-triazole, 5-methyl-N-methyl-1,2,3-triazole, 4-chloro-N-methyl-1,2,3-triazole, 5-chloro-N-methyl-1,2,3-triazole, 4-fluoro-N-methyl-1,2,3-triazole, 5-fluoro-N-methyl-1,2,3-triazole, 4-cyano-N-methyl-1,2,3-triazole, 5-cyano-N-methyl-1,2,3-triazole, 4-nitro-N-methyl-1,2,3-triazole, 5-nitro-N-methyl-1,2,3-triazole, methyl N-methyl-1,2,3-triazole-4-carboxylate, methyl N-methyl-1,2,3-triazole-5-carboxylate, ethyl N-methyl-1,2, 3-triazole-4-carboxylate, ethyl N-methyl-1,2,3-triazole-5-carboxylate, 4-trifluoromethyl-N-methyl-1,2,3-triazole, and 5-trifluoromethyl-N-methyl-1,2,3-triazole; tetrazole and substituted tetrazoles such as N-methyltetrazole, 5-methyl-tetrazole, 5-methyl-N-methyl-tetrazole, 5-chloro-tetrazole, 5-chloro-N-methyl-tetrazole, 5-fluoro-tetrazole, 5-fluoro-N-methyl-tetrazole, 5-nitro-tetrazole, 5-nitro-N-methyl-tetrazole, 5-cyano-tetrazole, 5-cyano-N-methyl-tetrazole, 5-trifluoromethyl-tetrazole, 5-trifluoromethyl-N-methyl-tetrazole, methyl 1H-1,2,3,4-tetrazole-5-carboxylate, ethyl 1H-1,2,3,4-tetrazole-5-carboxylate, methyl 1-methyl-1,2,3,4-tetrazole-5-carboxylate, ethyl 1-methyl-1,2,3,4-tetrazole-5-carboxylate, tetrazole-5-carboxaldehyde, 1H-tetrazole-5-carboxaldehyde, 1-methyl-1-(1-methyl-1H-1,2,3,4-tetrazol-5-yl)ethan-1-one, 1-(1H-1,2,3,4-tetrazol-5-yl)ethan-1-one; benzothiazole and substituted benzothiazoles such as 2-methyl-benzothiazole, 4-methyl-benzothiazole, 5-methyl-benzothiazole, 6-methyl-benzothiazole, 7-methyl-benzothiazole, 2-fluoro-benzothiazole, 4-fluoro-benzothiazole, 5-fluoro-benzothiazole, 6-fluoro-benzothiazole, 7-fluoro-benzothiazole, 2-chloro-benzothiazole, 4-chloro-benzothiazole, 5-chloro-benzothiazole, 6-chloro-benzothiazole, 7-chloro-benzothiazole, 2-cyano-benzothiazole, 4-cyano-benzothiazole, 5-cyano-benzothiazole, 6-cyano-benzothiazole, 7-cyano-benzothiazole, 2-nitro-benzothiazole, 4-nitro-benzothiazole, 5-nitro-benzothiazole, 6-nitro-benzothiazole, 7-nitro-benzothiazole, 2-trifluromethyl-benzothiazole, 4-trifluromethyl-benzothiazole, 5-trifluromethyl-benzothiazole, 6-trifluromethyl-benzothiazole, 7-trifluromethyl-benzothiazole, 2-benzothiazolecarboxylic acid methyl ester, 4-benzothiazolecarboxylic acid methyl ester, 5-benzothiazolecarboxylic acid methyl ester, 6-benzothiazolecarboxylic acid methyl ester, 7-benzothiazolecarboxylic acid methyl ester, 2-benzothiazolecarboxylic acid ethyl ester, 4-benzothiazolecarboxylic acid ethyl ester, 5-benzothiazolecarboxylic acid ethyl ester, 6-benzothiazolecarboxylic acid ethyl ester, 7-benzothiazolecarboxylic acid ethyl ester, benzothiazole-2-carbaldehyde, benzothiazole-4-carbaldehyde, benzothiazole-5-carbaldehyde, benzothiazole-6-carbaldehyde, benzothiazole-7-carbaldehyde, 2-acetylbenzothiazole, 4-acetylbenzothiazole, 5-Acetylbenzothiazole, 6-acetylbenzothiazole, and 7-acetylbenzothiazole, 3,4-dihydronaphthalen-1(2H)-one, 8-methyl-3,4-dihydronaphthalen-1(2H)-one, 7-methyl-3,4-dihydronaphthalen-1(2H)-one, 6-methyl-3,4-dihydronaphthalen-1(2H)-one, 5-methyl-3,4-dihydronaphthalen-1(2H)-one, 2,3-dihydro-1H-inden-1-one, 7-methyl-2,3-dihydro-1H-inden-1-one, 6-methyl-2,3-dihydro-1H-inden-1-one, 57-methyl-2,3-dihydro-1H-inden-1-one, and 4-methyl-2,3-dihydro-1H-inden-1-one.

Without wishing to be bound to any particular theory, it is believed that electronic devices incorporating an active semiconductor component prepared from the present formulation can exhibit improved efficiency, extended lifetime, and more stable performance because of the beneficial intermolecular interactions between the OSC and the first liquid, which is selected to complement the electronic properties of the OSC as described herein. While π-conjugated molecules having very different electron densities have been shown to exhibit strong π-π stacking due to dipole-dipole and/or quadrupole-quadrupole interaction, the phenomenon only has been reported with molecules in the same physical state (e.g., solid/solid or liquid/liquid). See e.g., Patrick et al., *Nature*, 187: 1021 (1960); and Lau et al., *Appl. Phys. Letts.*, 88(17): 173513/10 (2006). It is therefore surprising and unexpected to the inventors that an OSC in the solid state can interact strongly with an aromatic compound in the liquid state when the latter is tailored to have very different electron densities from the solid OSC. For crystalline OSC, this strong interaction between the OSC and the first liquid was supported by optical microscopy (FIGS. 5 and 6), which shows an increase in crystal grain size and crystalline domains with formulations using more electron-rich liquids. Without wishing to be bound to any particular theory, larger crystallites can contribute, at least in part, to improved charge transport, possibly because of the reduced number of grain boundaries which act as charge trapping sites. The beneficial interactions between the OSC and the first liquid can be further enhanced when the formulation includes an aromatic additive and/or a second liquid comprising an electron-neutral liquid as described herein.

The formulations according to the present teachings can be stable under ambient conditions ("ambient stable"). As used herein, a formulation can be considered "ambient stable" or "stable at ambient conditions" when the OSC does not form macroscopic particles in the formulation and the carrier mobility or the reduction-potential of the OSC is maintained at about its initial measurement when the formulation is exposed to ambient conditions at a temperature lower than about 50° C., for example, air, ambient temperature, and humidity, over a period of time. For example, a formulation according to the present teachings can be described as ambient stable if the carrier mobility or reduction potential of the OSC does not vary more than 20% or more than 10% from its initial value after exposure to ambient conditions at a temperature lower than about 50° C., including, air, humidity (<50%) and temperature, over a 3 day, 5 day, or 10 day period.

The present formulation can be used to enable or improve the solution-processability of the OSC therein into various articles, structures, or devices. As used herein, "solution-processable" refers to compounds, materials, or compositions that can be used in various solution-phase processes including spin-coating, printing (e.g., inkjet printing, screen printing, pad printing, offset printing, gravure printing, flexographic printing, lithographic printing, mass-printing and the like), spray coating, electrospray coating, drop casting, dip coating, and blade coating.

Various articles of manufacture including electronic devices, optical devices, and optoelectronic devices, such as organic field effect transistors (OFETs) (e.g., organic thin film transistors (OTFTs)), organic photovoltaics (OPVs), photodetectors, organic light emitting devices such as organic light emitting diodes (OLEDs) and organic light emitting transistors (OLETs), complementary metal oxide semiconductors (CMOSs), complementary inverters, diodes, capacitors, sensors, D flip-flops, rectifiers, and ring oscillators, can include a semiconductor component (e.g., a thin film semiconductor) that is deposited from a formulation according to the present teachings. The depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, drop-casting, zone casting, slot-coating, dip coating, blade coating, or spraying. In various embodiments, the semiconductor component can be deposited from the present formulation on a substrate at low temperatures. For example, the depositing step can be carried out at a temperature typically less than about 50° C., preferably lower than about 35° C., and more preferably around 25° C.

Accordingly, an aspect of the present teachings relates to methods of fabricating an organic field effect transistor (OFET) that incorporates a semiconductor component prepared from a formulation according to the present teachings. FIG. 1 illustrates the four common types of OFET structures: (a) bottom-gate top-contact structure, (b) bottom-gate bottom-contact structure, (c) top-gate bottom-contact structure, and (d) top-gate top-contact structure. As shown in FIG. 1, an OFET can include a gate dielectric component (e.g., shown as 8, 8', 8", and 8'"), a semiconducting component or semiconductor layer (e.g., shown as 6, 6', 6", and 6'"), a gate electrode or contact (e.g., shown as 10, 10', 10", and 10'"), a substrate (e.g., shown as 12, 12', 12", and 12'"), and source and drain electrodes or contacts (e.g., shown as 2, 2', 2", 2'", 4, 4', 4", and 4'"). As shown, in each of the configurations, the semiconducting component is in contact with the source and drain electrodes and the gate dielectric component.

In certain embodiments, OTFT devices can be fabricated with the present formulations on doped silicon substrates, using $SiC_2$ as the dielectric, in top-contact geometries. In particular embodiments, the active semiconductor layer which is prepared from a formulation according to the present teachings can be deposited at room temperature, or in any event, at a temperature less than or about 50° C. In other embodiments, the active semiconductor layer which is prepared from a formulation according to the present teachings can be applied by spin-coating or printing as described herein. For top-contact devices, metallic contacts can be patterned on top of the films using shadow masks.

In certain embodiments, OTFT devices can be fabricated with the present formulations on plastic foils, using polymers as the dielectric, in top-gate bottom-contact geometries. In particular embodiments, the active semiconducting layer which is prepared from a formulation according to the present teachings can be deposited at room temperature, or in any event, at a temperature less than or about 50° C. In other embodiments, the active semiconducting layer which is prepared from a formulation according to the present teachings can be applied by spin-coating or printing as described herein. Gate and source/drain contacts can be made of Au, other metals, or conducting polymers and deposited by vapor-deposition and/or printing.

In various embodiments, a semiconducting component prepared from a formulation according to the present teachings can exhibit semiconducting activity, for example, a carrier mobility of $10^{-4}$ cm$^2$/V-sec or greater and/or a current on/off ratio ($I_{on}/I_{off}$) of $10^3$ or greater.

Figure 2:
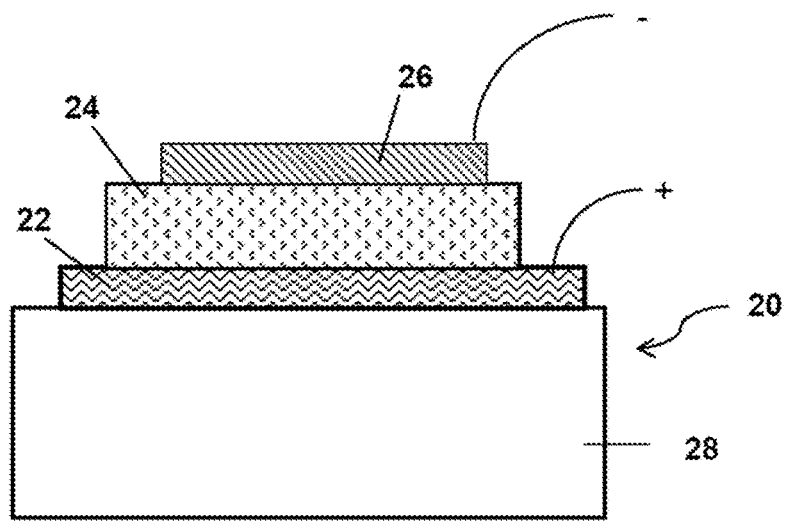
FIG. 2 illustrates a representative structure of a bulk-heterojunction organic photovoltaic device (also known as a solar cell), which can incorporate a donor material and/or an acceptor material prepared from a formulation according to the present teachings.
Figure 3:
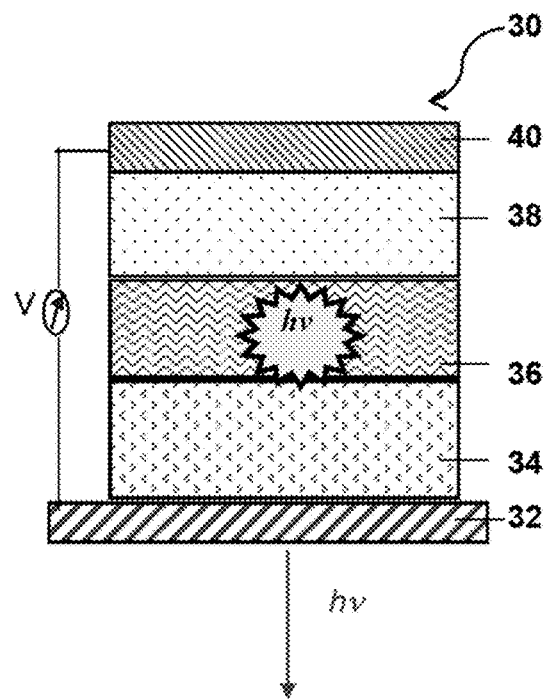
FIG. 3 illustrates a representative structure of an organic light-emitting device which can incorporate an electron-transporting material, an emissive material, and/or a hole-transporting material prepared from a formulation according to the present teachings.

Another aspect of the present teachings relates to methods of fabricating an organic light-emitting transistor, an organic light-emitting diode (OLED), or an organic photovoltaic device that incorporates one or more semiconductor materials prepared from a formulation according to the present teachings. FIG. 2 illustrates a representative structure of a bulk-heterojunction organic photovoltaic device (also known as solar cell) which can incorporate a donor and/or an acceptor material prepared from a formulation described herein. As shown, a representative solar cell 20 generally includes a substrate 28 (e.g., glass), an anode 22 (e.g., ITO), a cathode 26 (e.g., aluminium or calcium), and an active layer 24 between the anode and the cathode which can be prepared, at least in part (as the electron donor (p-channel) and/or electron acceptor (n-channel) materials), using a formulation according to the present teachings. One or more optional anode interlayers and/or one or more optional cathode interlayers also can be present. FIG. 3 illustrates a representative structure of an OLED. As shown, an OLED 30 generally includes a substrate (not shown), a transparent anode 32 (e.g., ITO), a cathode 40 (e.g., metal), and one or more organic layers including a hole-transporting (n-channel) layer (layer 34 as shown), an emissive layer (layer 36 as shown), and an electron-transporting (p-channel) layer (layer 38 as shown), at least one of which can be prepared from a formulation according to the present teachings.

The following examples are provided to illustrate further and to facilitate the understanding of the present teachings and are not in any way intended to limit the invention.

Example 1

Top-gate, bottom-contact (TGBC) thin film transistors according to the present teachings were prepared using n-type OSC formulations that includes N,N'-bis(2-ethylhexyl)-(1,7 & 1,6)-dicyanoperylene-3,4:9,10-bis(dicarboximide), 2EH-PDICN$_2$ as the n-type OSC and two different electron-rich liquids (N,N'-dimethylaniline, NDEA, and 2-methylanisole, 2MA) as examples of the first liquid. Comparative devices were prepared using formulations that include the same n-type OSC in an electron-neutral liquid (xylene or dichlorobenzene, DCB) or in an electron-poor liquid (benzonitrile, BN, or nitrobenzene, NBZ). The channel length is about 50 μm.

The devices were fabricated as follows: Step 1. A planarization layer was spin-coated on a glass substrate, followed by UV irradiation for 10 min. Step 2. Gold (30 nm) was thermally evaporated as S/D electrodes. Step 3. S/D electrodes were treated with a solution of 4-methylthiophenol (MeTP) in ethanol at room temperature for 5 hours then dried in a nitrogen gas stream. Step 4. The n-type OSC formulation (4 mg/mL) including a polymeric binder (2 mg/mL) was spin-coated at 1500 rpm for 12 s, then dried on a 120° C. hotplate, followed by baking for 5 min. Step 5. A polymeric dielectric, e.g., Cytop, was spin-coated on top as dielectric and baked on a 120° C. hotplate for 5 min. Step 6. Gold (30 nm) was thermally evaporated as gate electrode.

Figure 4:
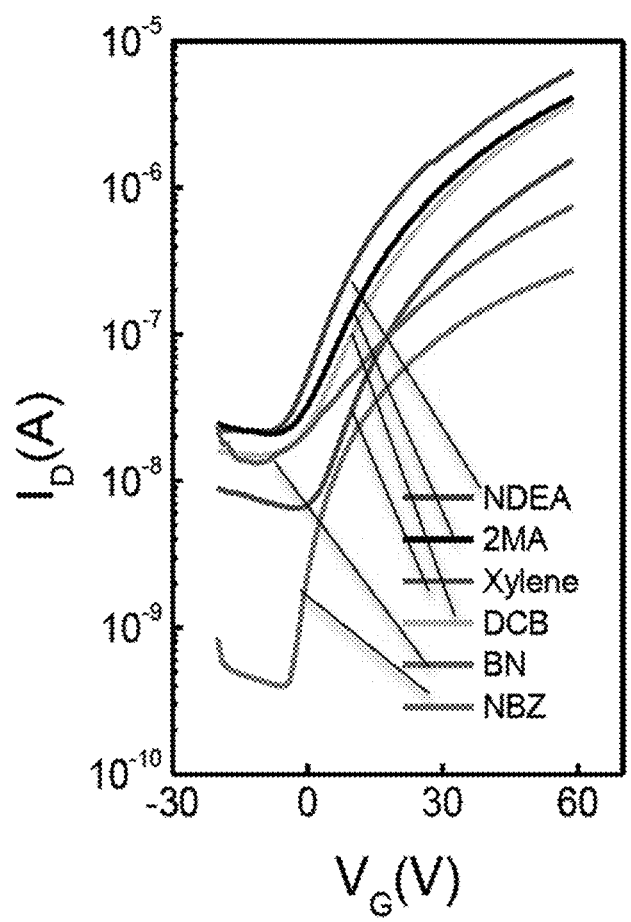
FIG. 4 shows representative transfer plots of top-gate, bottom-contact thin film transistors having an n-type active channel layer prepared from formulations according to the present teachings (including an electron-rich liquid) and comparative formulations (including either an electron-neutral liquid or an electron-poor liquid).

Table 2 below summarizes the electron mobilities (μ) of the different devices. It can be seen that formulations according to the present teachings (where the first liquid is an electron-rich liquid such as NDEA or 2MA) lead to a much high mobility than the comparative devices. In particular, when compared to formulations based upon an electron-poor liquid (BN or NBZ), the present formulations can lead to an electron mobility that is at least 6 times higher than the comparative devices. For the most electron-rich formulation tested (NDEA), the electron mobility was ~10-20 times larger than the devices prepared with an electron-poor liquid. FIG. 4 shows typical transfer plots for the tested devices.

TABLE 2

| Formulation | $\mu_{SAT}$ |
|---|---|
| 2EH-PDICN$_2$ in N,N'-dimethylaniline (NDEA) | 0.22 |
| 2EH-PDICN$_2$ in 2-methylanisole (2MA) | 0.14 |
| 2EH-PDICN$_2$ in xylene | 0.06 |
| 2EH-PDICN$_2$ in dichlorobenzene (DCB) | 0.13 |
| 2EH-PDICN$_2$ in benzonitrile (BN) | 0.02 |
| 2EH-PDICN$_2$ in nitrobenzene (NBZ) | 0.01 |

Figure 5:
FIG. 5 shows an optical microscopic image of a semiconducting thin film prepared from a formulation according to an embodiment of the present teachings that includes an n-type OSC and an electron-rich liquid (2-methylanisole).
Figure 6:
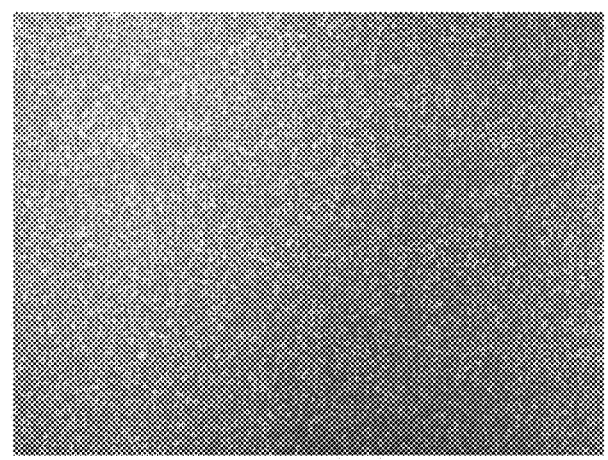
FIG. 6 shows an optical microscopic image of a semiconducting thin film prepared from a formulation according to another embodiment of the present teachings that includes an n-type OSC and an electron-rich liquid (N,N'-dimethylaniline).

FIGS. 5 and 6 show optical microscopic images of semiconducting thin films prepared from a formulation including 2EH-PDICN$_2$ in 2MA (FIG. 5) and a formulation including 2EH-PDICN$_2$ in NDEA (FIG. 6). It can be seen that the NDEA formulation creates larger crystallites than the 2MA formulation, suggesting that the use of a more electron-rich liquid (NDEA) can lead to stronger interaction between the OSC and the first liquid, which in turn results in larger crystal grain size and crystalline domains. The optical microscopy data seems to suggest a correlation between crystal grain size and charge carrier mobility, as the NDEA formulation provides a 50% higher mobility than the 2MA formulation.

For less crystalline or amorphous semiconductors, improvements in charge transport provided by the present formulations can be the result of better film morphology at the nanoscale which cannot be assessed by optical microscopy.

Example 2

Top-gate, bottom-contact (TGBC) thin film transistors according to the present teachings were prepared using p-type OSC formulations that includes dihexyl quarterthiophene (DH4T) as the p-type OSC and two different electron-poor liquids (benzonitrile, BN, or quinoline, QL) as examples of the first liquid. Comparative devices were prepared using formulations that include the same p-type OSC in an electron-neutral liquid (xylene) or in an electron-rich liquid (2-methylanisole, 2MA). The channel length is about 50 µm.

The devices were fabricated as follows: Step 1. A planarization layer was spin-coated on a glass substrate, followed by UV irradiation for 10 min. Step 2. Gold (30 nm) was thermally evaporated as S/D electrodes. Step 3. S/D electrodes were treated with pentafluorobenzene thiol (PFBT). Step 4. The p-type OSC formulation (4 mg/mL) including a polymeric binder (2 mg/mL) was spin-coated at 1500 rpm for 12 s, then dried on a 120° C. hotplate, followed by baking for 5 min. Step 5. A polymeric dielectric, e.g., Cytop, was spin-coated on top as dielectric and baked on a 120° C. hotplate for 5 min. Step 6. Gold (30 nm) was thermally evaporated as gate electrode.

Figure 7:
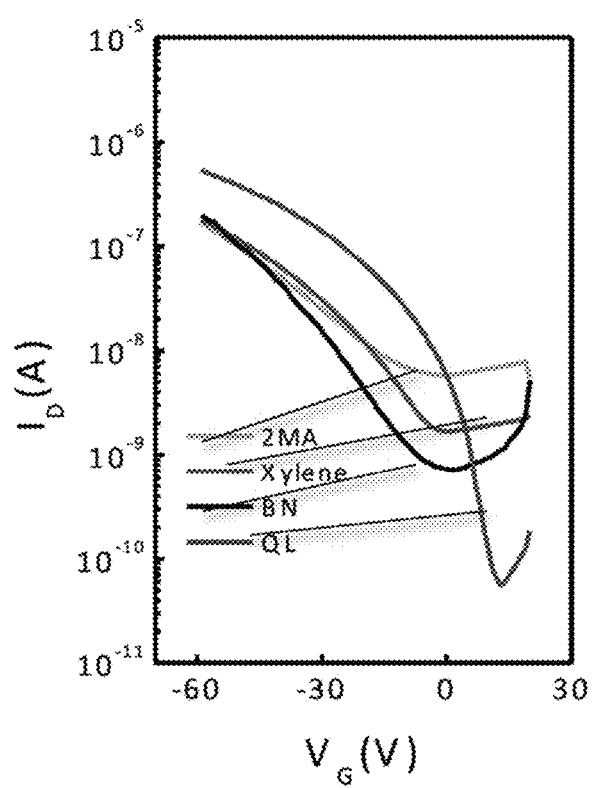
FIG. 7 shows representative transfer plots of top-gate, bottom-contact thin film transistors having a p-type active channel layer prepared from formulations according to the present teachings (including an electron-poor liquid) and comparative formulations (including either an electron-neutral liquid or an electron-rich liquid).

Table 3 below summarizes the hole mobilities (u) of the different devices. It can be seen that formulations according to the present teachings (where the first liquid is an electron-poor liquid such as BN or QL) lead to a much high mobility than the comparative devices. In particular, when compared to formulations based upon an electron-rich liquid (2MA) or an electron-neutral liquid (xylene), the present formulations lead to a hole mobility that is about 4 times higher than the comparative devices. FIG. 7 shows typical transfer plots for the tested devices.

TABLE 3

| Formulation | $\mu_{SAT}$ |
|---|---|
| DH4T in 2-methylanisole (2MA) | 0.01 |
| DH4T in xylene | 0.01 |
| DH4T in benzonitrile (BN) | 0.04 |
| DH4T in quinoline (QL) | 0.04 |

All publications, including but not limited to patents and patent applications, cited in this specification are herein incorporated by reference as if each individual publication were specifically and individually indicated to be incorporated by reference herein as though fully set forth.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. An organic semiconductor formulation comprising a p-type organic semiconducting compound in a liquid medium, wherein the p-type organic semiconducting compound is selected from the group consisting of an oligothiophene, a thienocoronene, and a thienoacene; and the liquid medium consists essentially of a first liquid and optionally a second liquid, the first liquid being an electron-poor liquid
(a) is selected from the group consisting of 1-trifluoromethyl-naphthalene, 2-(trifluoromethyl)naphthalene, 2-cyanonaphthalene, 1-cyanonaphthalene, 2-naphthaldehyde, 1-naphthaldehyde, 1-(1-naphthalenyl)ethanone, methyl 2-naphthyl ketone, methyl 2-naphthalenecarboxylate, methyl 1-naphthalenecarboxylate, 1-nitronaphthalene, 2-nitronaphthalene, 5-(trifluoromethyl)-1,2,3,4-tetrahydronaphthalene, 5,6,7,8-tetrahydronaphthalene-2-carbonitrile, 5,6,7,8-tetrahydronaphthalene-1-carbonitrile, 6-nitro-1,2,3,4-tetrahydronaphthalene, 5-nitro-1,2,3,4-tetrahydronaphthalene, methyl 5,6,7,8-tetrahydronaphthalene-1-carboxylate, methyl 5,6,7,8-tetrahydronaphthalene-2-carboxylate; or
(b) is an aromatic compound having a core consisting of a phenyl group fused to a cycloheteroalkyl group comprising at least one of —C(O)—, —SO$_2$—, and —CF$_2$— in the ring, wherein the cycloheteroalkyl group is selected from the group consisting of:

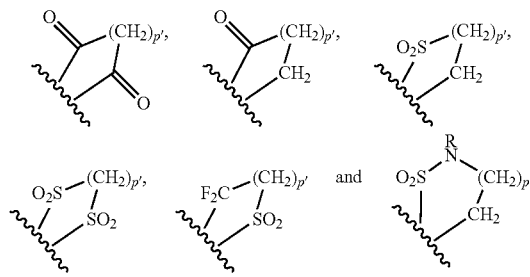

wherein R is H or a C$_{1-6}$ alkyl group; and p' is 1 or 2; and
the second liquid being selected from the group consisting of petroleum ethers, acetonitrile, benzene, toluene, o-xylene, m-xylene, p-xylene, cyclohexylbenzene, 1-methyl naphthalene, 2-methylnaphthalene, 1-ethyl naphthalene, 2-ethylnapthalene, 1,2,4-trimethylbenzene, mesitylene, tetraline, indane, indene, acetone, methyl ethyl ketone, tetrahydrofuran, dioxane, bis(2-methoxyethyl) ether, diethyl ether, di-isopropyl ether, t-butyl methyl ether, methyl acetate, ethyl acetate, methyl formate, ethyl formate, isopropyl acetate, butyl acetate, cyclopentanone, cyclohexanone, and 2-methypyrrolidone.

2. The formulation of claim 1, wherein the electron-poor liquid is selected from the group consisting of 1-trifluoromethyl-naphthalene, 2-(trifluoromethyl)naphthalene, 2-cyanonaphthalene, 1-cyanonaphthalene, 2-naphthaldehyde, 1-naphthaldehyde, 1-(1-naphthalenyl)ethanone, methyl 2-naphthyl ketone, methyl 2-naphthalenecarboxylate, methyl 1-naphthalenecarboxylate, 1-nitronaphthalene, 2-nitronaphthalene, 5-(trifluoromethyl)-1,2,3,4-tetrahydronaphthalene, 5,6,7,8-tetrahydronaphthalene-2-carbonitrile, 5,6,7, 8-tetrahydronaphthalene-1-carbonitrile, 6-nitro-1,2,3,4-tetrahydronaphthalene, 5-nitro-1,2,3,4-tetrahydronaphthalene, methyl 5,6,7,8-tetrahydronaphthalene-1-carboxylate, and methyl 5,6,7,8-tetrahydronaphthalene-2-carboxylate.

3. The formulation of claim 1, wherein the electron-poor liquid is an aromatic compound having a core consisting of a phenyl group fused to a cycloheteroalkyl group comprising at least one of —C(O)—, —SO$_2$—, and —CF$_2$— in the ring, wherein the cycloheteroalkyl group is selected from the group consisting of:

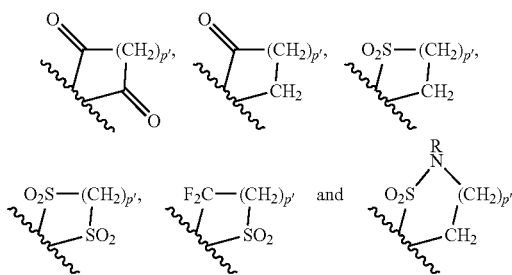

wherein R is H or a $C_{1-6}$ alkyl group; and p' is 1 or 2.

4. The formulation of claim 1, wherein the p-type organic semiconducting compound is a thienoacene.

5. The formulation of claim 4, wherein the p-type organic semiconducting compound is a thienoacene selected from the group consisting of alkylated [1]benzothieno[3,2-b]benzothiophenes, alkylated dinaphtho[2,3-b:2',3'-f]thieno[3,2-b]thiophenes, and alkylated dibenzo[d,d']thieno[3,2-b;4,5-b']dithiophenes.

6. The formulation of claim 1, wherein the p-type organic semiconducting compound is an oligothiophene, wherein the oligothiophene is dihexyl quarterthiophene.

7. The formulation of claim 1, wherein the first liquid is present in an amount of about 10 vol % to about 50 vol % of the total volume of the formulation, and the second liquid is present in an amount of about 50 vol % to about 90 vol % of the total volume of the formulation.

8. The formulation of claim 3, wherein the electron-poor liquid selected from the group consisting of 3,4-dihydronaphthalen-1(2H)-one, 8-methyl-3,4-dihydronaphthalen-1(2H)-one, 7-methyl-3,4-dihydronaphthalen-1(2H)-one, 6-methyl-3,4-dihydronaphthalen-1(2H)-one, 5-methyl-3,4-dihydronaphthalen-1(2H)-one, 2,3-dihydro-1H-inden-1-one, 7-methyl-2,3-dihydro-1H-inden-1-one, 6-methyl-2,3-dihydro-1H-inden-1-one, 5-methyl-2,3-dihydro-1H-inden-1-one, and 4-methyl-2,3-dihydro-1H-inden-1-one.

9. An organic semiconductor formulation comprising a p-type organic semiconducting compound in a liquid medium, wherein the p-type organic semiconducting compound is selected from the group consisting of an oligothiophene, a thienocoronene, and a thienoacene; and the liquid medium consists essentially of a first liquid and optionally a second liquid,
the first liquid being an electron-poor liquid comprising an aromatic compound having either (i) at least one electron-withdrawing functional group ($FG^{ewd}$) as a substituent, (ii) an electron-poor aromatic core, or both (i) and (ii), the electron-poor liquid being represented by the formula:

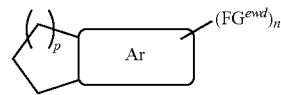

in which p is 0, 1 or 2 and Ar is a phenyl group or a naphthyl group optionally substituted with 1-4 groups independently selected from Cl and a $C_{1-6}$ alkyl group, or

in which Ar is a naphthyl group optionally substituted with 1-4 groups independently selected from Cl and a $C_{1-6}$ alkyl group, or

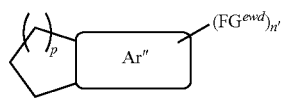

in which p is 0, 1 or 2 and Ar" is an electron-poor 5-14 membered heteroaryl group or a phenyl group fused to an electron-poor 5-, 6- or 7-membered cycloheteroalkyl group optionally substituted with 1-4 groups independently selected from Cl and a $C_{1-6}$ alkyl group, or

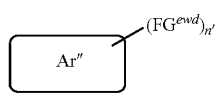

in which Ar" is a phenyl group fused to an electron-poor 5-, 6- or 7-membered cycloheteroalkyl group optionally substituted with 1-4 groups independently selected from Cl and a $C_{1-6}$ alkyl group;
wherein
$FG^{ewd}$, at each occurrence, independently is selected from —NO$_2$, —CN, —NC, —S(R$^b$)$_2^+$, —N(R$^b$)$_3^+$, —SC$_3$H, —SO$_2$R$^b$, —SO$_3$R$^b$, —SO$_2$NHR$^b$, —SO$_2$N(R$^b$)$_2$, —COOH, —COR$^b$, —COOR$^b$, —CONHR$^b$, —CON(R$^b$)$_2$, and CF$_3$; wherein R$^b$, at each occurrence, independently is a $C_{1-20}$ alkyl group, a $C_{1-20}$ haloalkyl group, a —Y'—$C_{6-14}$ aryl group, or a —Y'—$C_{3-14}$ cycloalkyl group; Y' is a divalent $C_{1-20}$ alkyl group, a divalent $C_{1-20}$ haloalkyl group or a covalent bond; and each of the $C_{6-14}$ aryl group and the $C_{3-14}$ cycloalkyl group optionally is substituted with 1-4 groups independently selected from F, Cl, Br, I, a methyl group, an ethyl group, and a propyl group,
n, at each occurrence, is 1, 2, 3 or 4, and
n', at each occurrence is 0, 1, 2, 3 or 4;
the first liquid being in liquid state at about 1 atm at a temperature of 50° C. or less; and
the second liquid being selected from the group consisting of petroleum ethers, acetonitrile, benzene, toluene, o-xylene, m-xylene, p-xylene, cyclohexylbenzene, 1-methyl naphthalene, 2-methylnaphthalene, 1-ethyl naphthalene, 2-ethylnapthalene, 1,2,4-trimethylbenzene, mesitylene, tetraline, indane, indene, acetone, methyl ethyl ketone, tetrahydrofuran, dioxane, bis(2-methoxyethyl) ether, diethyl ether, di-isopropyl ether, t-butyl methyl ether, methyl acetate, ethyl acetate, methyl formate, ethyl formate, isopropyl acetate, butyl acetate, cyclopentanone, cyclohexanone, and 2-methypyrrolidone.

10. The formulation of claim 9, wherein the electron-poor liquid is represented by the formula:

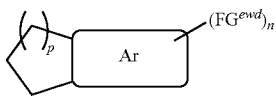

in which p is 0, 1 or 2 and Ar is a phenyl or naphthyl group optionally substituted with 1-4 groups independently selected from Cl and a $C_{1-6}$ alkyl group.

11. The formulation of claim 10, wherein p is 2.

12. The formulation of claim 11, wherein the electron-poor liquid is selected from the group consisting of 5-(trifluoromethyl)-1,2,3,4-tetrahydronaphthalene, 5,6,7,8-tetrahydronaphthalene-2-carbonitrile, 5,6,7,8-tetrahydronaphthalene-1-carbonitrile, 6-nitro-1,2,3,4-tetrahydronaphthalene, 5-nitro-1,2,3,4-tetrahydronaphthalene, methyl 5,6,7,8-tetrahydronaphthalene-1-carboxylate, and methyl 5,6,7,8-tetrahydronaphthalene-2-carboxylate.

13. The formulation of claim 9, wherein the electron-poor liquid is represented by the formula:

in which Ar is a naphthyl group optionally substituted with 1-4 groups independently selected from Cl and a $C_{1-6}$ alkyl group.

14. The formulation of claim 13, wherein the electron-poor liquid is selected from the group consisting of 1-trifluoromethyl-naphthalene, 2-(trifluoromethyl)naphthalene, 2-cyanonaphthalene, 1-cyanonaphthalene, 2-naphthaldehyde, 1-naphthaldehyde, 1-(1-naphthalenyl)ethanone, methyl 2-naphthyl ketone, methyl 2-naphthalenecarboxylate, methyl 1-naphthalenecarboxylate, 1-nitronaphthalene, and 2-nitronaphthalene.

15. The formulation of claim 9, wherein the electron-poor liquid is represented by the formula:

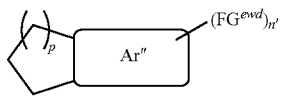

in which p is 0, 1 or 2 and Ar″ is an electron-poor 5-14 membered heteroaryl group or a phenyl group fused to an electron-poor 5-, 6- or 7-membered cycloheteroalkyl group optionally substituted with 1-4 groups independently selected from Cl and a $C_{1-6}$ alkyl group.

16. The formulation of claim 9, wherein the electron-poor liquid is represented by the formula:

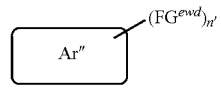

in which Ar″ is a phenyl group fused to an electron-poor 5-, 6- or 7-membered cycloheteroalkyl group optionally substituted with 1-4 groups independently selected from Cl and a $C_{1-6}$ alkyl group.

17. The formulation of claim 9, wherein the p-type organic semiconducting compound is a thienoacene.

18. The formulation of claim 17, wherein the p-type organic semiconducting compound is a thienoacene selected from the group consisting of alkylated [1]benzothieno[3,2-b]benzothiophenes, alkylated dinaphtho[2,3-b:2',3'-f]thieno[3,2-b]thiophenes, and alkylated dibenzo[d,d']thieno[3,2-b;4,5-b]dithiophenes.

19. The formulation of claim 8, wherein the first liquid is present in an amount of about 10 vol % to about 50 vol % of the total volume of the formulation, and the second liquid is present in an amount of about 50 vol % to about 90 vol % of the total volume of the formulation.

* * * * *